(12) United States Patent
Nakamura et al.

(10) Patent No.: US 8,994,159 B2
(45) Date of Patent: Mar. 31, 2015

(54) SEMICONDUCTOR DEVICE AND MANUFACTURING METHOD THEREOF

(71) Applicants: Hiroyuki Nakamura, Kanagawa (JP); Akira Muto, Kanagawa (JP); Nobuya Koike, Kanagawa (JP); Atsushi Nishikizawa, Kanagawa (JP); Yukihiro Sato, Kanagawa (JP); Katsuhiko Funatsu, Kanagawa (JP)

(72) Inventors: Hiroyuki Nakamura, Kanagawa (JP); Akira Muto, Kanagawa (JP); Nobuya Koike, Kanagawa (JP); Atsushi Nishikizawa, Kanagawa (JP); Yukihiro Sato, Kanagawa (JP); Katsuhiko Funatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/740,354

(22) Filed: Jan. 14, 2013

(65) Prior Publication Data
US 2013/0127032 A1    May 23, 2013

Related U.S. Application Data

(63) Continuation of application No. 12/718,200, filed on Mar. 5, 2010, now Pat. No. 8,367,479.

(30) Foreign Application Priority Data

Apr. 9, 2009    (JP) ................................. 2009-094648

(51) Int. Cl.
H01L 23/495        (2006.01)
H01L 21/48         (2006.01)
(Continued)

(52) U.S. Cl.
CPC .......... *H01L 23/495* (2013.01); *H01L 21/4828* (2013.01); *H01L 21/565* (2013.01); *H01L 23/3107* (2013.01); *H01L 23/49503* (2013.01); *H01L 23/49541* (2013.01); *H01L 23/49548* (2013.01); *H01L 23/49582* (2013.01); *H01L 24/32* (2013.01); *H01L 24/48* (2013.01); *H01L 24/83* (2013.01); *H01L 21/56* (2013.01); *H01L 24/29* (2013.01); *H01L 2224/32245* (2013.01);
(Continued)

(58) Field of Classification Search
USPC ................... 257/676, 787, E23.001, E23.18; 438/123; 29/827
See application file for complete search history.

(56) References Cited

U.S. PATENT DOCUMENTS 5,633,528 A    5/1997    Abbott et al.
7,190,057 B2   3/2007    Seki et al.
(Continued)

FOREIGN PATENT DOCUMENTS

CN    101164165 A    4/2008
JP    62-287657 A    12/1987
(Continued)

OTHER PUBLICATIONS

JP OA for JP App. No. 2009-94648, dated Dec. 24, 2013.
(Continued)

*Primary Examiner* — Roy Potter
(74) *Attorney, Agent, or Firm* — Mattingly & Malur, P.C.

(57) ABSTRACT

To prevent, in a resin-sealed type semiconductor package, generation of cracks in a die bonding material used for mounting of a semiconductor chip. A semiconductor chip is mounted over the upper surface of a die pad via a die bonding material, followed by sealing with an insulating resin. The top surface of the die pad to be brought into contact with the insulating resin is surface-roughened, while the bottom surface of the die pad and an outer lead portion are not surface-roughened.

28 Claims, 19 Drawing Sheets

(51) Int. Cl.
*H01L 21/56* (2006.01)
*H01L 23/31* (2006.01)
*H01L 23/00* (2006.01)

(52) U.S. Cl.
CPC ............... *H01L 2224/48091* (2013.01); *H01L 2224/48247* (2013.01); *H01L 2224/484* (2013.01); *H01L 2224/49171* (2013.01); *H01L 2224/73265* (2013.01); *H01L 2224/838* (2013.01); *H01L 2224/85439* (2013.01); *H01L 2224/85455* (2013.01); *H01L 2224/92247* (2013.01); *H01L 2924/01002* (2013.01); *H01L 2924/01004* (2013.01); *H01L 2924/01028* (2013.01); *H01L 2924/01029* (2013.01); *H01L 2924/01033* (2013.01); *H01L 2924/01047* (2013.01); *H01L 2924/01078* (2013.01); *H01L 2924/01082* (2013.01); *H01L 2924/01088* (2013.01); *H01L 2924/014* (2013.01); *H01L 2924/078* (2013.01); *H01L 2924/14* (2013.01); *H01L 24/49* (2013.01); *H01L 2224/2919* (2013.01); *H01L 2924/00014* (2013.01); *H01L 2924/01005* (2013.01); *H01L 2924/01006* (2013.01); *H01L 2924/0665* (2013.01); *H01L 2224/451* (2013.01); *H01L 2924/15747* (2013.01)
USPC ..................................... 257/676; 257/E23.001

(56) References Cited

U.S. PATENT DOCUMENTS

| | | | |
|---|---|---|---|
| 7,262,491 | B2 | 8/2007 | Islam et al. |
| 8,367,479 | B2 * | 2/2013 | Nakamura et al. ............ 438/123 |
| 2002/0153596 | A1 | 10/2002 | Tsubosaki et al. |
| 2009/0039486 | A1 | 2/2009 | Shimazaki et al. |

FOREIGN PATENT DOCUMENTS

| | | | |
|---|---|---|---|
| JP | 02-222567 | A | 9/1990 |
| JP | 5-218275 | A | 8/1993 |
| JP | 2000-68303 | A | 3/2000 |
| JP | 2002-83917 | A | 3/2002 |
| JP | 2005-191178 | A | 7/2005 |
| JP | 2006-140265 | A | 6/2006 |
| JP | 2006245478 | | 9/2006 |
| JP | 2006-310397 | A | 11/2006 |
| JP | 2009-010407 | A | 1/2009 |
| JP | 2009-507394 | A | 2/2009 |
| WO | 9934444 | A1 | 7/1999 |

OTHER PUBLICATIONS

Japanese Office Action received in Japanese Application No. 2012-238546 dated Apr. 30, 2014.
Japanese Office Action received in Japanese Application No. 2009-094648 dated May 27, 2014.

* cited by examiner

SEMICONDUCTOR DEVICE AND MANUFACTURING METHOD THEREOF

CROSS-REFERENCE TO RELATED APPLICATIONS

This application is a continuation application of U.S. Ser. No. 12/718,200, filed Mar. 5, 2010, which relates to and claims priority from Japanese Patent Application No. 2009-94648 filed on Apr. 9, 2009. The entire disclosures of all of these applications are hereby incorporated by reference.

BACKGROUND OF THE INVENTION

The present invention relates to a semiconductor device and a manufacturing method thereof, particularly to a technology effective when applied to a semiconductor device in the form of a resin-sealed type semiconductor package and a manufacturing method thereof.

In semiconductor devices, a semiconductor chip is protected to keep its performance by sealing (packaging) the semiconductor chip with an insulating resin material or the like. For example, a semiconductor device is formed by attaching (mounting) a semiconductor chip having thereover an integrated circuit typified by a memory circuit, a logic circuit, a power circuit, or the like on the chip mounting portion (die pad) of a lead frame with a paste material and sealing a portion of the lead frame and the semiconductor chip with an insulating resin. In recent years, copper or copper alloy has been used as the material of the lead frame because it has high electric conductivity and heat conductivity and at the same time, costs low.

For example, Japanese Unexamined Patent Publication No. 2005-191178 (Patent Document 1) discloses a technology of forming, in a heat spreader, a dimple having an inwardly protruded sidewall and thereby improving adhesion with an insulating resin.

Japanese Unexamined Patent Publication No. Hei 5 (1993)-218275 (Patent Document 2) discloses a technology of forming dimples by press molding on a lead frame in order to improve adhesion with a sealing material and thereby eliminating the warp of the island.

Japanese Unexamined Patent Publication No. 2002-83917 (Patent Document 3) discloses a technology of actualizing a lead frame having high adhesion between a resin and a lead frame by etching a portion of the surface of the lead frame to form a plurality of protrusions selectively thereon.

[Patent Document 1] Japanese Unexamined Patent Publication No. 2005-191178

[Patent Document 2] Japanese Unexamined Patent Publication No. Hei 5 (1993)-218275

[Patent Document 3] Japanese Unexamined Patent Publication No. 2002-83917

SUMMARY OF THE INVENTION

As a result of investigation of a package structure (semiconductor package) having a high heat radiation property, the present inventors have found that a package, as illustrated in FIG. 21, in which a bottom surface f2a of a die pad DPa is exposed from an insulating resin IRa is effective. Heat generated in a semiconductor chip CPa can be released outside easily by exposing the bottom surface f2a of the die pad DPa from the insulating resin IRa. If a semiconductor chip has such a form, the bottom surface f2a of the die pad DPa exposed outside can also be used as an electrode.

Further investigation by the present inventors has however revealed that the problems described below occur in a semiconductor device having the package form as illustrated in FIG. 21. Described specifically, it has been found that a semiconductor device in a package form from which the bottom surface f2a of the die pad DPa is exposed has deteriorated electrical properties in a temperature cycling test or the like. It has been found further that as illustrated in FIG. 22, generation of a crack ck in the die bonding material DBa in the vicinity of the boundary face between the die pad DPa and the insulating resin IRa takes part in the deterioration of electrical properties in the temperature cycling test. FIG. 22 is an enlarged view of a main portion p10a of the semiconductor device of FIG. 21. The present inventors have considered the cause for the crack ck generated in the die bonding material DBa and it will next be described in detail.

When the bottom surface f2a of the die pad DPa is exposed outside, moisture is likely to penetrate into the insulating resin IRa during storage of the semiconductor device. It is to be noted that since there is a difference in a thermal expansion coefficient between the die pad DPa and the insulating resin IRa, heating at the time of reflow soldering or the like causes peeling at the boundary surface therebetween. Penetration of the above-described moisture into such a peeled portion raises an inner pressure of the peeled portion and causes expansion. After temperature cycling, a stress due to a linear expansion difference between the members in the vicinity of the peeled portion results in a crack ck of the die bonding material DBa.

For example, there is a semiconductor device in which a semiconductor chip CPa needs a conducting electrode also on the back side thereof and therefore uses the bottom surface f2a of the die pad DPa as the electrode. In this case, the die bonding material DBa is required to provide electric conduction between the semiconductor chip CPa and the die pad DPa. The investigation by the present inventors has revealed that when a crack occurs in such a die bonding material DBa, it may be a cause for an electrical conduction failure; and as a result, it may be a cause for deteriorating the electrical properties and reliability of the semiconductor device.

An object of the invention is to improve the reliability of a semiconductor device having a structure in which a semiconductor chip has been sealed with an insulating resin and particularly, to provide a technology capable of preventing cracks of a die bonding material.

The above-described and the other objects, and novel features of the invention will be apparent from the description herein and accompanying drawings.

In one mode of the invention, there is provided a technology of, in a semiconductor device obtained by mounting a semiconductor chip on the top surface of a die pad portion via a die bonding material, roughening the top surface of the die pad portion to be brought into contact with the insulating resin, while not roughening the bottom surface of the die pad portion and an outer lead portion.

An advantage available by the above-described one example, among a plurality of the inventions disclosed herein, will next be described briefly as a typical one.

In short, the invention can improve the reliability of a semiconductor device having a structure in which a semiconductor chip has been sealed with an insulating resin.

BRIEF DESCRIPTION OF THE DRAWINGS

FIGS. 1(A) and 1(B) are explanatory views illustrating the structure of a semiconductor device according to Embodiment 1 of the invention, in which FIG. 1(A) is an overall plan view and FIG. 1(A) is a cross-sectional view taken along the line B-B of FIG. 1(A) and viewed in an arrow direction;

FIGS. 3(A) and 3(B) are explanatory views illustrating another structure of the semiconductor device according to Embodiment 1 of the invention, in which FIG. 3(A) is an overall plan view and FIG. 3(B) is a cross-sectional view taken along the line B-B of FIG. 3(A) and viewed in an arrow direction;

FIGS. 4(A) and 4(B) are explanatory views illustrating a further structure of the semiconductor device according to Embodiment 1 of the invention, in which FIG. 4(A) is an overall plan view and FIG. 4(B) is a cross-sectional view taken along the line B-B of FIG. 4(A) and viewed in an arrow direction;

FIGS. 5(A) and 5(B) are explanatory views illustrating a still further structure of the semiconductor device according to Embodiment 1 of the invention, in which FIG. 5(A) is an overall plan view and FIG. 5(b) is a cross-sectional view taken along the line B-B of FIG. 5(A) and viewed in an arrow direction;

FIGS. 6(A) and 6(B) are explanatory views illustrating a still further structure of the semiconductor device according to Embodiment 1 of the invention, in which FIG. 6(A) is an overall plan view and FIG. 6(b) is a cross-sectional view taken along the line B-B of FIG. 6(A) and viewed in an arrow direction;

FIGS. 13(A) and 13(B) are explanatory views illustrating the semiconductor device of Embodiment 1 of the invention during a manufacturing step thereof, in which FIG. 13(A) is a fragmentary plan view and FIG. 13(B) is a fragmentary cross-sectional view taken along the line B-B of FIG. 13(A) and viewed in an arrow direction;

FIGS. 16(A) and 16(B) are explanatory views illustrating the semiconductor device of Embodiment 1 of the invention during another manufacturing step thereof, in which FIG. 16(A) is a fragmentary plan view and FIG. 16(B) is a fragmentary cross-sectional view taken along the line B-B of FIG. 16(A) and viewed in an arrow direction;

FIGS. 17(A) and 17(B) are explanatory views illustrating the semiconductor device of Embodiment 1 of the invention during a further manufacturing step thereof, in which FIG. 17(A) is a fragmentary plan view and FIG. 17(B) is a fragmentary cross-sectional view taken along the line B-B of FIG. 17(A) and viewed in an arrow direction;

FIGS. 18(A) and 18(B) are explanatory views illustrating the semiconductor device of Embodiment 1 of the invention during a still further manufacturing step thereof, in which FIG. 18(A) is a fragmentary plan view and FIG. 18(B) is a fragmentary cross-sectional view taken along the line B-B of FIG. 18(A) and viewed in an arrow direction;

FIGS. 19(A) and 19(B) are explanatory views illustrating the semiconductor device of Embodiment 1 of the invention during a still further manufacturing step thereof, in which FIG. 19(A) is a fragmentary plan view and FIG. 19(B) is a fragmentary cross-sectional view taken along the line B-B of FIG. 19(A) in an arrow direction;

DETAILED DESCRIPTION OF THE PREFERRED EMBODIMENTS

Figure 1A:
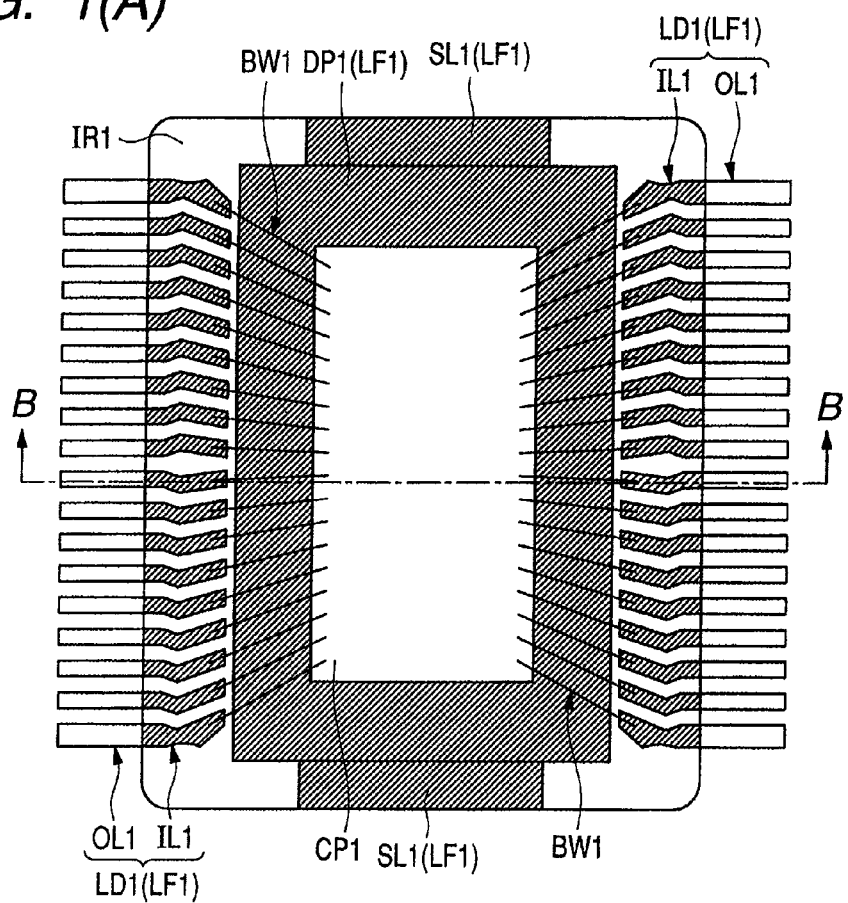

In the below-described embodiments, a description will be made after divided in plural sections or in plural embodiments if necessary for convenience's sake. These plural sections or embodiments are not independent each other, but in a relation such that one is a modification example, details, or complementary description of a part or whole of the other one unless otherwise specifically indicated. In the below-described embodiments, when a reference is made to the number of elements (including the number, value, amount, and range), the number of elements is not limited to a specific number but can be greater than or less than the specific number unless otherwise specifically indicated or in the case it is principally apparent that the number is limited to the specific number. Moreover in the below-described embodiments, it is needless to say that the configuring elements (including element steps) are not always essential unless otherwise specifically indicated or in the case where it is principally apparent that they are essential. Similarly, in the below-described embodiments, when a reference is made to the shape, positional relationship, or the like of the configuring elements, that substantially analogous or similar to it is also embraced unless otherwise specifically indicated or in the case where it is different in principle. This also applies to the above-described value and range. In all the drawings for describing the below-described embodiments, members having like function will be identified by like reference numerals and overlapping descriptions will be omitted wherever possible. The embodiments of the invention will hereinafter be described in detail referring to some drawings.

Embodiment 1

In Embodiment 1, first, the problems that a semiconductor device having a structure investigated by the present inventors and a manufacturing method thereof have will be described specifically.

Figure 21:
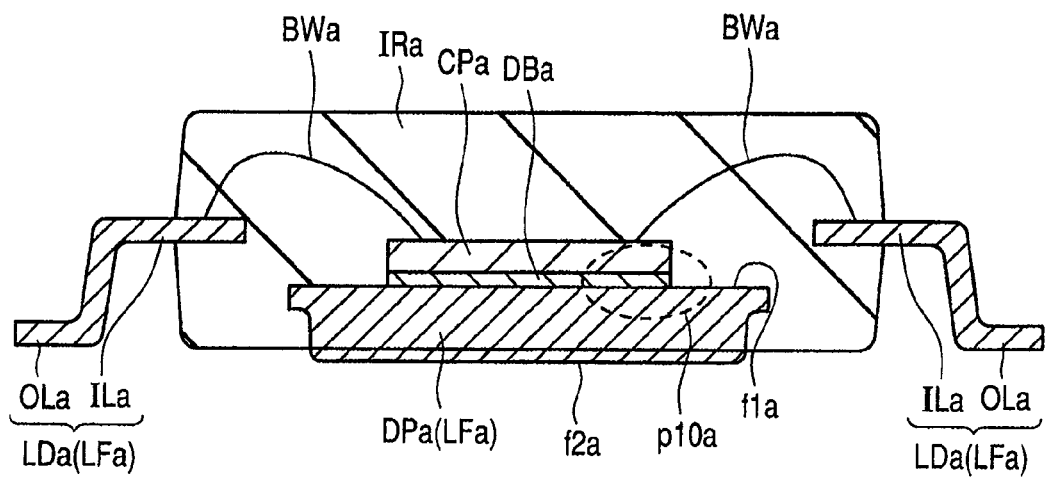
FIG. 21 is a cross-sectional view illustrating the structure of a semiconductor device investigated by the present inventors.
Figure 22:
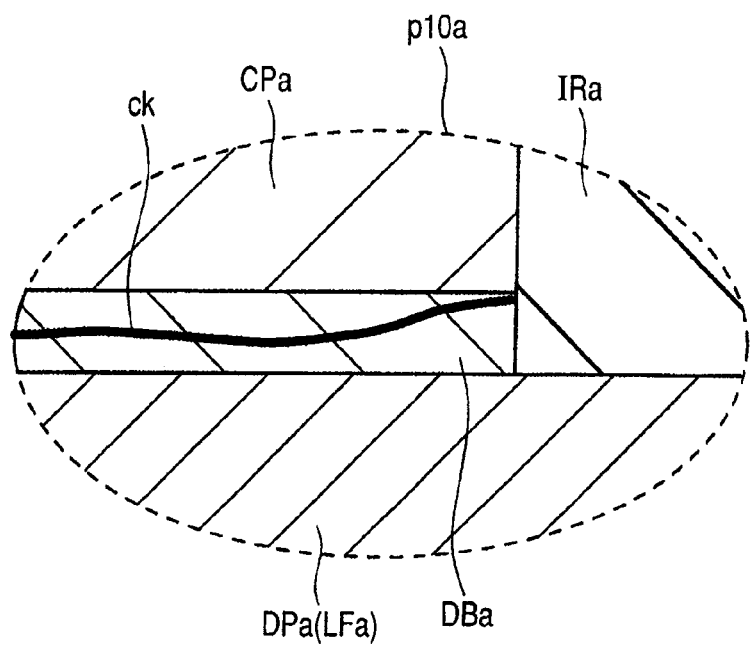
FIG. 22 is a fragmentary enlarged view of the semiconductor device of FIG. 21.

As described referring to FIGS. 21 and 22, it has been found that in the package (semiconductor package) structure in which the bottom surface f2a of the die pad DPa is exposed from the insulating resin IRa, the insulating resin (molding resin) IRa is likely to peel easily in the vicinity of the boundary between the die pad DPa and the insulating resin IRa. The semiconductor device therefore has as a problem thereof deterioration of reliability. As a result of further investigation with a view to overcoming the problem, the present inventors have found that adhesion with the insulating resin IRa can be improved by etching and roughening the surfaces of the die pad DPa and a plurality of lead portions LDa. The insulating resin IRa is filled in concavities and convexities formed by the surface roughening and exhibits an anchor effect to prevent peeling. Such an effect is marked when the insulating resin IRa is an epoxy resin.

A manufacturing method of a semiconductor device including a surface roughening step of a lead frame LFa having such a peeling prevention effect will next be described briefly.

First, a semiconductor wafer which has finished formation of semiconductor elements thereon is diced into semiconductor chips CPa. In addition, a lead frame LFa formed of a die pad DPa comprised of copper or a copper alloy and a plurality of lead portions LDa is prepared. The lead frame LFa is immersed in an etching solution and etched to have a roughened surface. Then, the semiconductor chip CPa is bonded onto the die pad DPa of the lead frame LFa with a die bonding material DBa and a desired electrode on the semiconductor chip CPa is coupled with a desired lead portion LDa with a bonding wire BWa. The configuration thus obtained is then sealed with the insulating resin IRa, followed by cutting of a suspension lead portion that fixes the die pad DPa to the lead frame LFa. Then, a resin burr comprised of an unnecessary portion of the insulating resin IRa is removed. After a desired plating step and a desired marking step, the lead portion from which an unnecessary portion has been cut off is molded, whereby manufacture of a semiconductor device is completed.

As described above, etching and surface roughening of the lead frame LFa can improve the adhesion with the insulating resin IRa. From this viewpoint, it has been found that generation of cracks ck in the die bonding material DBa due to temperature cycling can be suppressed and reliability can be improved. Further investigation by the present inventors has however revealed that another problem occurs in the above-described surface roughening technology.

Figure 23:
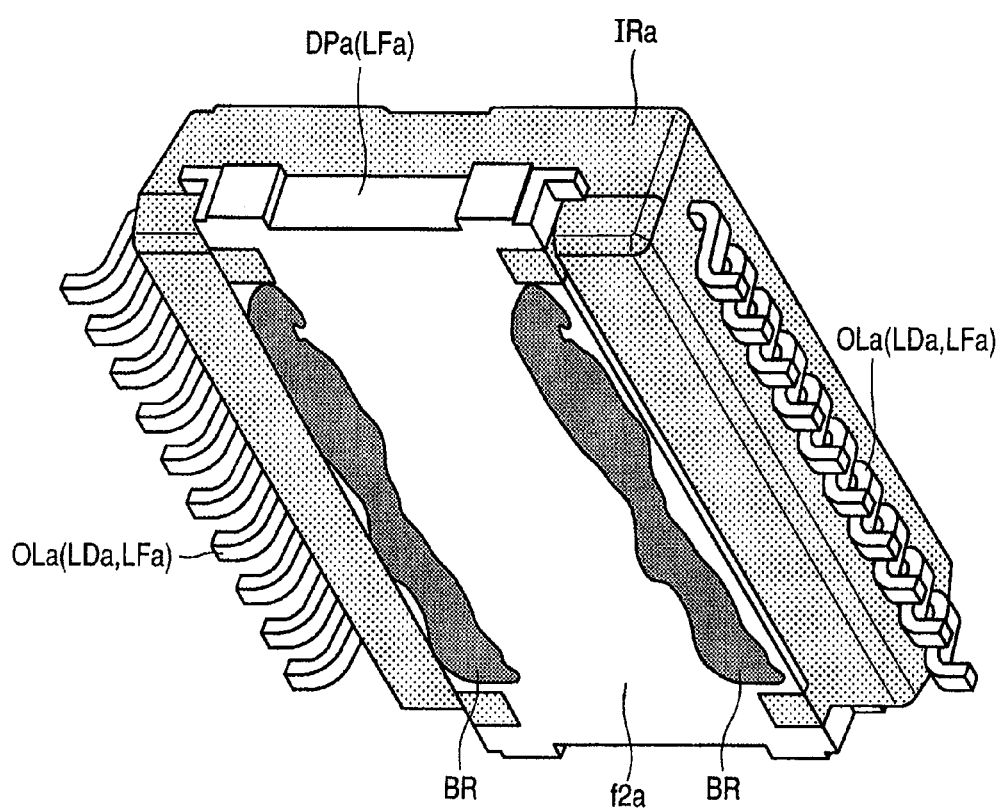
FIG. 23 is an explanatory view of the semiconductor device of FIG. 21.

For example, when both the upper and lower surfaces of the lead frame LFa are etched to roughen them, the surface roughening extends even to the bottom surface f2a of the die pad DPa. This means the insulating resin IRa adheres firmly also to the roughened bottom surface f2a. In the semiconductor device of Embodiment 1, the bottom surface f2a of the die pad DPa should be exposed from the insulating resin IRa. As illustrated in FIG. 23, however, there is a possibility of the insulating resin IRa, which has firmly adhered to the bottom surface d2a of the die pad DPa, remaining as a resin burr BR even after a burr removing step. FIG. 23 is an explanatory view illustrating the appearance of the semiconductor device investigated here. The resin bur BR that has remained on the exposed bottom surface f2a of the die pad DPa may be a cause for mounting failure or electrical properties failure. In addition, such a resin burr BR may fall in a subsequent cutting step or the like and cause generation of foreign particles.

With a view to avoiding such a problem, the present inventors have investigated a method of etching one surface (top surface) of the lead frame LFa while not roughening the bottom surface f2a of the die pad DPa. This enables to produce an effect of suppressing the generation, as described above, of a crack ck in the die bonding material DBa without leaving the resin burr BR as illustrated in FIG. 23.

Still further investigation by the present inventors has however revealed that the above-described method of roughening one surface (upper surface) of the lead frame LFa causes a problem as described below.

For example, when an inner lead portion ILa to be coupled with the bonding wire BWa has been plated, the surface roughening may damage the plated portion, though depending on the combination of the kind of plating and kind of a surface-roughening etching solution. Such damage to the main conduction portion may become one of the causes of deterioration in electrical properties and may eventually become a cause of deterioration in the reliability of the resulting semiconductor device.

In addition, when the surface roughening extends to, for example, the outer lead portion OLa outside the insulating resin IRa or a suspension lead portion for fixing the die pad to the lead frame, the insulating resin IRa that has adhered firmly may remain in these regions. It has been found that when the resin remains in these regions, particularly in the region (for example, tie bar) to be cut in the later step, there is a possibility of the residue falling in the cutting step and becoming a cause for generation of foreign particles or the residue breaking a cutting die.

As described above, it has been found by the investigation of the present inventors that even roughening one of the surfaces of the lead frame LFa deteriorates the reliability of a semiconductor device when the entirety of the one of the surfaces is roughened. In Embodiment 1, in order to overcome this problem, a semiconductor device using a lead frame obtained by roughening only a portion of one of the surfaces and a manufacturing method of the device will be described.

Figure 1B:
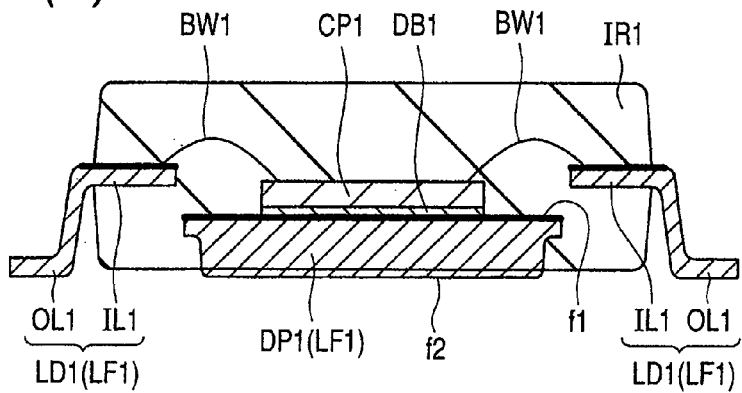

FIG. 1(A) is an overall plan view of a semiconductor device of Embodiment 1, while FIG. 1(B) is a cross-sectional view taken along the line B-B of FIG. 1(A) and viewed in a direction of the arrow. The semiconductor device of Embodiment 1 has the following configuration. It is to be noted that the overall plan view of FIG. 1(A) is a view seen through the insulating resin IR1.

The semiconductor device of Embodiment 1 has a die pad DP1 and a plurality of lead portions LD1. The die pad DP1 is made of a conductor comprised mainly of copper. As will be described specifically later in the description of its manufacturing method, the die pad DP1 and the plural lead portions LD1 are originally members configuring the same lead frame LF1. Accordingly, the plural lead portions LD1 and the die pad DP1 are made of the same material, that is, a conductor comprised mainly of copper. The die pad DP1 is a rectangular flat-plate member placed at the center portion of the semiconductor device when the entirety of the semiconductor device is viewed from the top. This die pad DP1 in flat plate form has a top surface (surface, first main surface) f1 and a bottom surface (second main surface) f2 placed opposite to each other when viewed in a thickness direction. The plural lead portions LD1 are placed at the periphery of the die pad DP1 so that they extend along two sides in the longitudinal direction of the rectangular die pad DP1 and are spaced to each other.

A suspension lead portion SL1 is formed at the end portion in a short-side direction of the rectangular die pad DP1. In other words, the suspension lead portion SL1 is placed to protrude at the end portion of the short-side direction of the rectangular die pad DP1. The suspension lead portion SL1 is also originally a member configuring the same lead frame LF1 similar to the die pad DP1 and the plural lead portions LD1. The suspension lead portion will be described more specifically later in the description of the manufacturing method.

The die pad DP1 has, on the top surface f1 thereof, a semiconductor chip CP1 equipped with a semiconductor element configuring a desired integrated circuit or the like. The semiconductor chip CP1 is placed on the top surface f1 of the die pad DP1 so that the former is bonded to the latter with a die bonding material DB1. In other words, the semiconductor chip CP1 is placed on the top surface f1 of the die pad DP1 via the die bonding material DB1. The die bonding material DB1 may be either a resin paste material or a solder material having conductivity.

The plural lead portions LD1 and the semiconductor chip CP1 are coupled via a plurality of bonding wires BW1. The plural bonding wires BW1 are coupled to a pad electrode (not illustrated) on the semiconductor chip CP1. The pad electrode is rendered conductive with the semiconductor element via an interconnect formed on the semiconductor chip CP1. A portion of each of the plural lead portions LD1 has been plated with a conductor comprised mainly of silver (Ag) or Ni and the plural bonding wires BW1 are coupled to the plated portions, respectively.

A portion of each of the plural lead portions LD1, the die pad DP1, and the suspension lead portion SL1, and the semiconductor chip CP1 are sealed integrally. The insulating resin IR1 is a resin material made of an epoxy resin.

The above-described suspension lead portion SL1 is a member for supporting the die pad DP1 on the entirety of the lead frame F1 and it is cut after completion of a sealing step with the insulating resin IR1, which will be described later in detail in the description of the manufacturing method. Accordingly, a portion of the end surface of the suspension lead portion SL1 is exposed from the insulating resin IR1.

A portion of each of the plural the lead portions LD1 which has been plated and coupled to each of the plural bonding wires BW1 is sealed with the insulating resin IR1. Such a portion of each of the plural lead portions LD1 covered with the insulating resin IR1 is called "inner lead portion IL1". The other portion of each of the plural the lead portions LD1 is not sealed with the insulating resin IR1 and is formed to be extracted outside of the insulating resin IR1. A portion of each of the plural the lead portions LD1 exposed and extracted outside of the insulating resin IR1 is called "outer lead portion OL1".

Such a structure enables electrical coupling to the semiconductor chip CP1 from the outside through the plural lead portions LD1 coupled thereto via the plural bonding wires BW1.

In the semiconductor device of Embodiment 1, the bottom surface f2 of the die pad DP1 is exposed outside of the insulating resin IR1. Heat generated from the semiconductor chip CP1 can be easily dissipated outside by exposing the bottom surface f2 of the die pad DP1 outside. In short, the semiconductor device of Embodiment 1 has a package structure with a high heat radiating property.

In the semiconductor device of Embodiment 1, the die pad DP1, the plural lead portions LD1, and the suspension lead portions SL1 have partially a rough surface. The term "rough surface" means a roughened surface.

Figure 2:
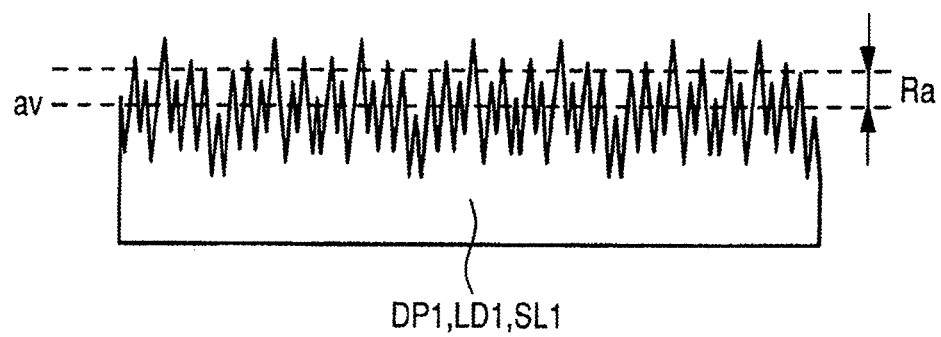
FIG. 2 is an explanatory view of the semiconductor device according to Embodiment 1 of the invention.

FIG. 2 is an explanatory view illustrating portions of the die pad DP1, the plural lead portions LD1, and the suspension lead portion SL1, which portions have a rough surface. The term "rough surface" as used herein means a surface having irregular minute concavities and convexities as illustrated in FIG. 2. In Embodiment 1, the term "concavities and convexities" meaning the rough surface has an arithmetic average roughness Ra preferably within a range of from 0.2 to 0.5 μm. The reason for it will be described later in detail because it has a relationship with a surface roughening treatment process. A region having no rough surface has an arithmetic average roughness Ra of 0.1 μm or less.

The term "arithmetic average roughness Ra" means a value obtained by sampling, from a concave-convex curve as illustrated in FIG. 2, only a reference length in the direction of the average line av, summing absolute values of the deviation of the sampled portion from the average line av to the measurement curve, and then averaging it. Qualitatively, the greater the difference in height between the concavities and convexities and the more widely it varies, the greater the arithmetic average roughness Ra.

The rough surface region of the die pad DP1, the plural lead portions LD1, and the suspension lead portion SL1 will next be described more specifically. The rough surface region of the die pad DP1, the plural lead portions LD1, and the suspension lead portion SL1, which is illustrated in FIG. 1, is hatched in the overall plan view (FIG. 1(A)) and is shown with a thicker solid line in the fragmentary cross-sectional view (FIG. 1(B)). In the semiconductor device of Embodiment 1, one surface (top surface) of each of the die pad DP1, the inner lead portions IL1 of the plural lead portions LD1, and the suspension lead portion SD1 that is brought into contact with the insulating resin IR1 is a rough surface. This enables to improve the adhesion between the insulating resin IR1 and the die pad DP1, the plural lead portions LD1, and the suspension lead portions SL1 as described above. In the semiconductor device of Embodiment 1, the bottom surface f2 of the die pad DP1 is exposed outside of the insulating resin IR1 and the bottom surface f2 of the die pad DP1 is not a rough surface.

More specifically, in the semiconductor device of Embodiment 1, the top surface f1 of the die pad DP1 including the portion thereof brought into contact with the insulating resin IR1 is a rough surface. This enables to improve the adhesion between the die pad DP1 and the insulating resin IR1 at the surface boundary thereof. This makes it difficult to cause peeling between the die pad DP1 and the insulating resin IR1 at the periphery of the semiconductor chip CP1. Accordingly, although the package structure seems to permit easy moisture penetration because the bottom surface f2 of the die pad DP1 is exposed, it does not permit easy moisture penetration at least at the periphery of the die bonding material DB1. This makes it possible to prevent generation of cracks in the die bonding material DB1. As a result, the semiconductor device having a semiconductor chip sealed with an insulating resin can have further improved reliability.

In addition, since the bottom surface f2 of the die pad DP1 is exposed outside in the semiconductor device of Embodiment 1, the die pad DP1 itself can be used as an electrode for electrically coupling the die pad DP1 itself to the semiconductor chip CP1 from the outside, separately from the plural lead portions LD1. When the die pad DP1 itself is used as an electrode, it is desired that no resin burr remains on the bottom surface f2 of the die pad DP1, because the burr of the insulating resin IR1 made of, for example, an epoxy resin and being an insulator remains on the die pad DP1 used as an electrode, electrical troubles may occur. In the semiconductor device of Embodiment 1, the bottom surface f2 of the die pad DP1 exposed from the insulating resin IR1 is not a rough surface and does not exhibit high adhesion with the insulating resin IR1 so that the resin burr hardly remains after a burr removing step. A semiconductor device free from electrical troubles can be realized by such a structure.

As an element formed on the semiconductor chip CP1, there is also an element having an electrode on both of upper and lower sides of the semiconductor chip. In other words, there is an element having an electrode on a surface opposite to a surface which the plural bonding wires BW1 are coupled to and which is bonded to the die pad DP1 via the die bonding material DB1. In this case, a material having conductivity is used as the die bonding material DB1. A solder material is an example of such a material having conductivity. When a material having conductivity is used as the die bonding material DB1, using the die pad DP1 as an electrode enables to provide electric conduction to the semiconductor chip CP1 via the die bonding material DB1. From this viewpoint, application of the semiconductor device of Embodiment 1, which uses a die bonding material resistant to cracks, to a structure in which the die bonding material DB1 itself is used as an electrically conductive member is more effective, because when the die bonding material DB1 is used as an electrically conductive member, cracks generated therein may be a cause for an electrical conduction failure. As a result, the semiconductor device having a semiconductor chip sealed with an insulating resin can have further improved reliability.

Further, in the semiconductor device of Embodiment 1, the outer lead portion OL1 of each of the plural lead portions LD1 does not have a rough surface. As described above, the outer lead portion OL1 is exposed from the insulating resin IR1 and essentially, the insulating resin IR1 does not attach to the portion. When such an outer lead portion OL1 has a rough surface, the adhesion with the insulating resin IR1 increases, making it difficult to remove the resin burr attached during the manufacturing step. The resin attached to a portion which is essentially free from attachment may cause troubles. For example, in the tie bar cutting step (which will be described specifically later), the fallen resin may become a cause of generation of foreign particles or damage the cutting mold. On the other hand, the semiconductor device of Embodiment 1 is less likely to cause troubles as described above, because the outer lead portion OL1 does not have a rough surface and therefore the insulating resin IR1 does not easily attached thereto. As a result, the semiconductor device having a semiconductor chip sealed with an insulating resin can have further improved reliability.

Figure 3A:
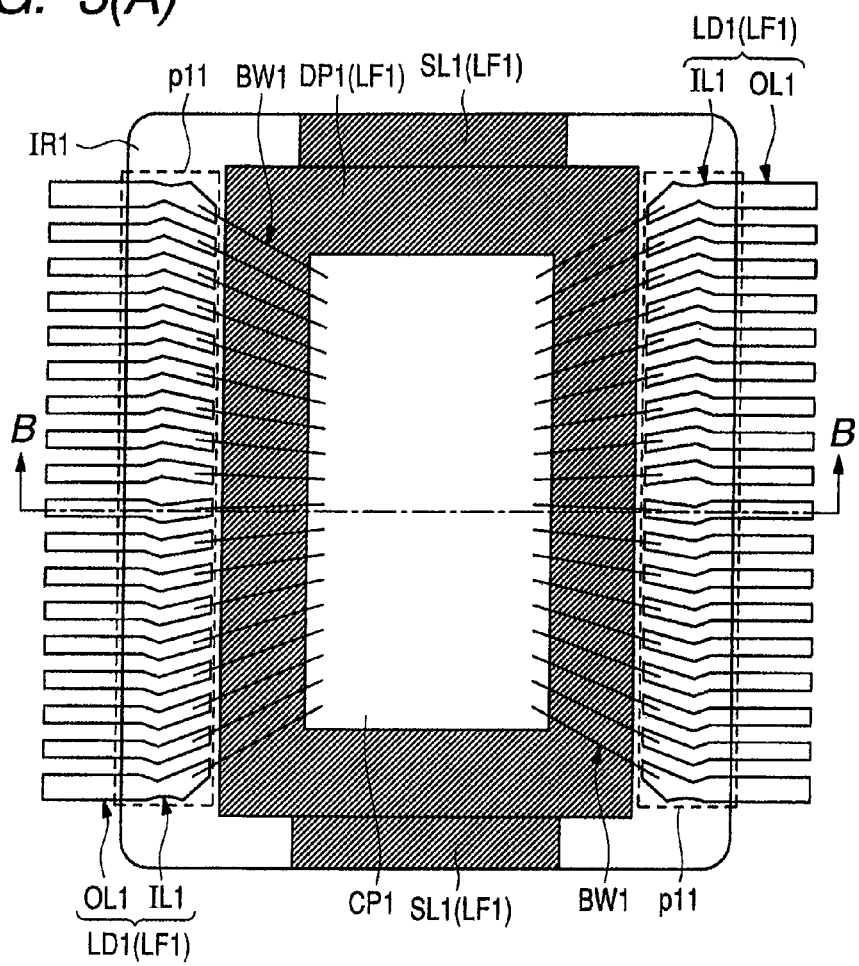
Figure 3B:
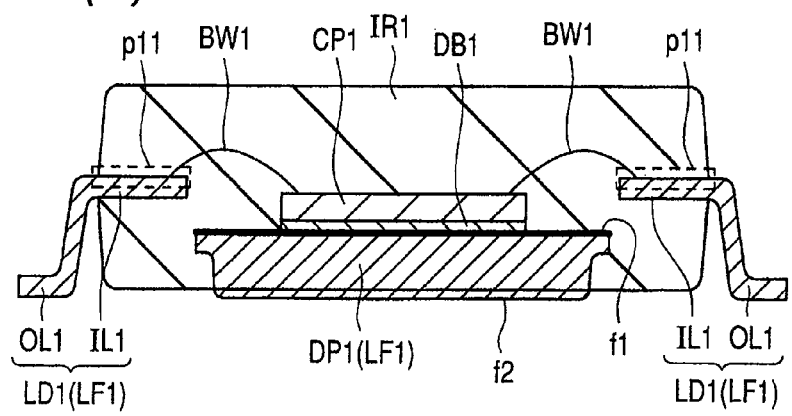

FIG. 3 is an explanatory view illustrating a region of another semiconductor device of Embodiment 1 similar to the region of FIG. 1. In the semiconductor device of Embodiment 1, as illustrated in FIG. 3, it is more preferred that a portion p11, which is a portion of each of the plural lead portions LD1, sealed with the insulating resin IR1, that is, the inner lead portion IL1 does not have a rough surface, because the inner lead portion IL1 is sometimes subjected to a plating treatment for coupling to the plural bonding wires BW1 as described above and the plated portion may be damaged in a surface roughening step which will be described later. Accordingly, it is possible to reduce the damage to the plated portion by not roughening the surface of the inner lead portion IL1. As a result, the semiconductor device having a semiconductor chip sealed with an insulating resin can have further improved reliability.

Verification by the present inventors has revealed that in combination of the surface roughening step (which will be described more specifically later) of the lead frame LF1 with plating with Ni, the plated portion is particularly susceptible to damage. Application of the above-described structure to the inner lead portion ILa plated with a conductor comprised mainly of Ni is therefore more effective.

Figure 4A:
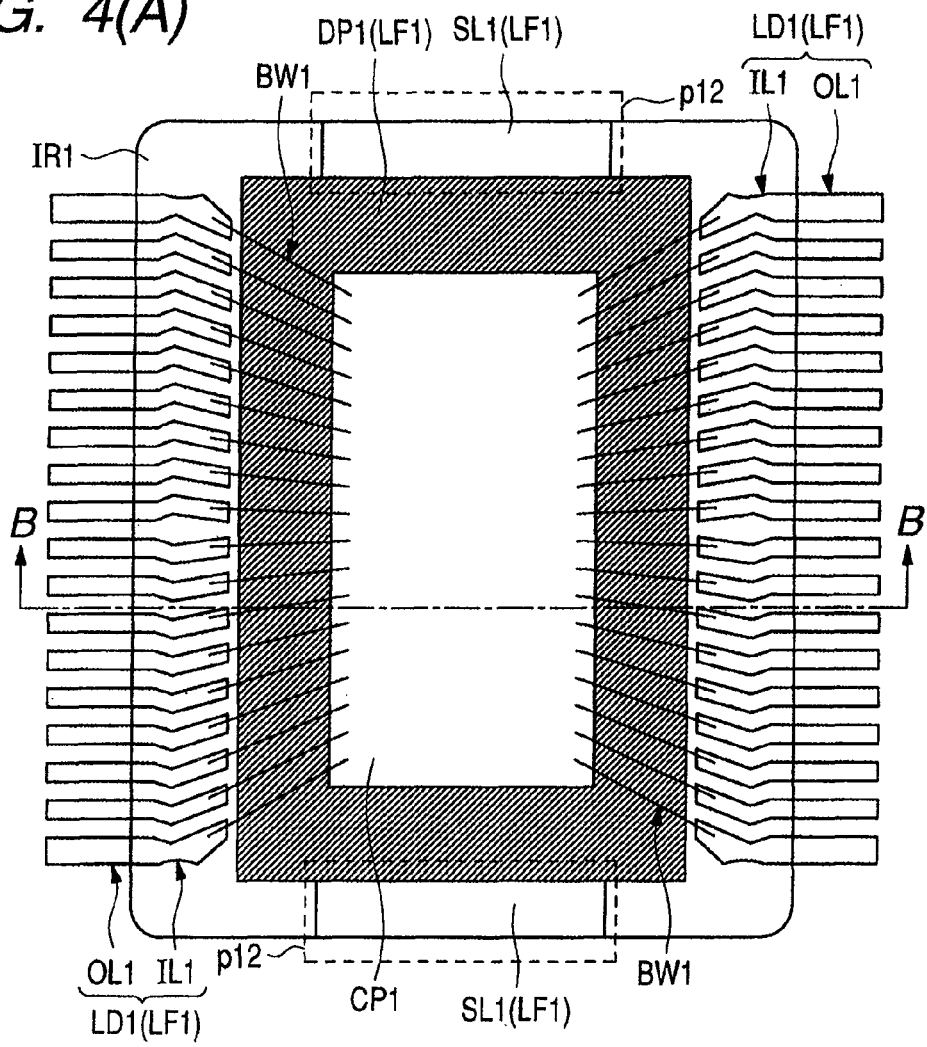
Figure 4B:
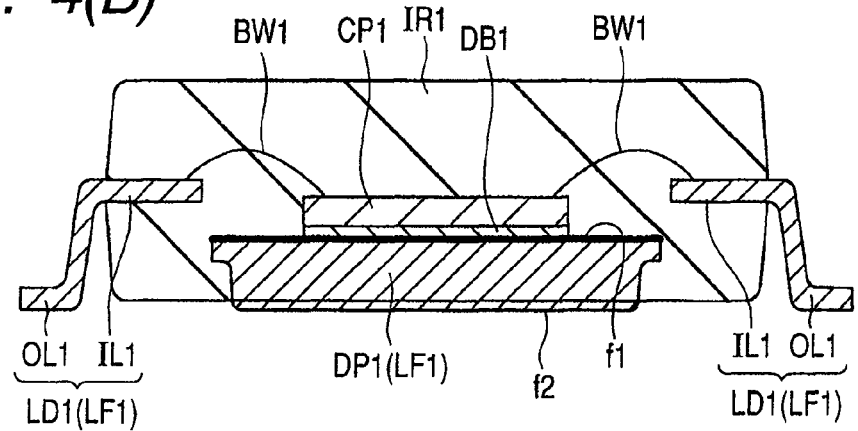

FIG. 4 is an explanatory view of a region of a further semiconductor device of Embodiment 1 similar to the region of FIG. 1. In the semiconductor device of Embodiment 1, it is more preferred that a portion p12, which is a portion of the suspension lead portion SL1, sealed with the insulating resin IR1 does not have a rough surface. The reason is as follows. As described above, the suspension lead portion SL1 is originally a member configuring the lead frame LF1 integrally together with the die pad DP1 and the plural lead portions LD1 and it is cut after sealing with the insulating resin IR1 (the step will be described later). When a firmly attached insulating resin IR1 remains at a position to be cut, the residue may fall during the cutting step and become a cause of generation of foreign particles or break the cutting mold. Accordingly, by not roughening the surface of the suspension lead portion SL1 and thereby not increasing the adhesion with the insulating resin IR1, the structure can easily avoid such problems.

In the semiconductor devices having structures as described referring to FIGS. 3 and 4, there is a fear of reduction in the above-described advantage if the adhesion of the insulating resin IR1 decreases by narrowing a rough surface region. A further verification of the present inventors has however revealed that such a reduction in the advantage does not occur because of the following reason.

In the semiconductor devices of Embodiment 1 illustrated in FIGS. 3 and 4, damage to the plated portion or troubles in the cutting step can be eliminated by not roughening the surface of the inner lead portion IL1 or the suspension lead portion SL1, but the adhesion with the insulating resin IR1 at these portions lowers. The present inventors however have found that after water penetrates into the peeling between the die pad DP1 and the insulating 15, wherein plating is formed on a part of the inner-lead occur in the die bonding material DB1. Accordingly, peeling of the insulating resin IR1 from the die pad DP1 at the periphery of the semiconductor chip CP1 is a cause of the cracks in the die bonding material DB1 and the peeling of the insulating resin IR1 from the inner lead portion IL1 or the suspension lead portion SL1 does not pose any problem from this standpoint. In other words, according to the semiconductor device of Embodiment 1, a structure in which a portion of the upper surface f1 of the die pad DP1 surrounding the periphery of the semiconductor chip CP1, when viewed from the top, has a rough surface is most effective for suppressing cracks of the die bonding material DB1. Thus, the structure of Embodiment 1 as illustrated in FIG. 3 or FIG. 4 in which one surface (upper surface) of the inner lead portion IL1 or the suspension lead portion SL1 has not been roughed does not interfere with the resolution of the above-described problem and at the same time can avoid the damage to a plated portion or the trouble in the cutting step.

Figure 5A:
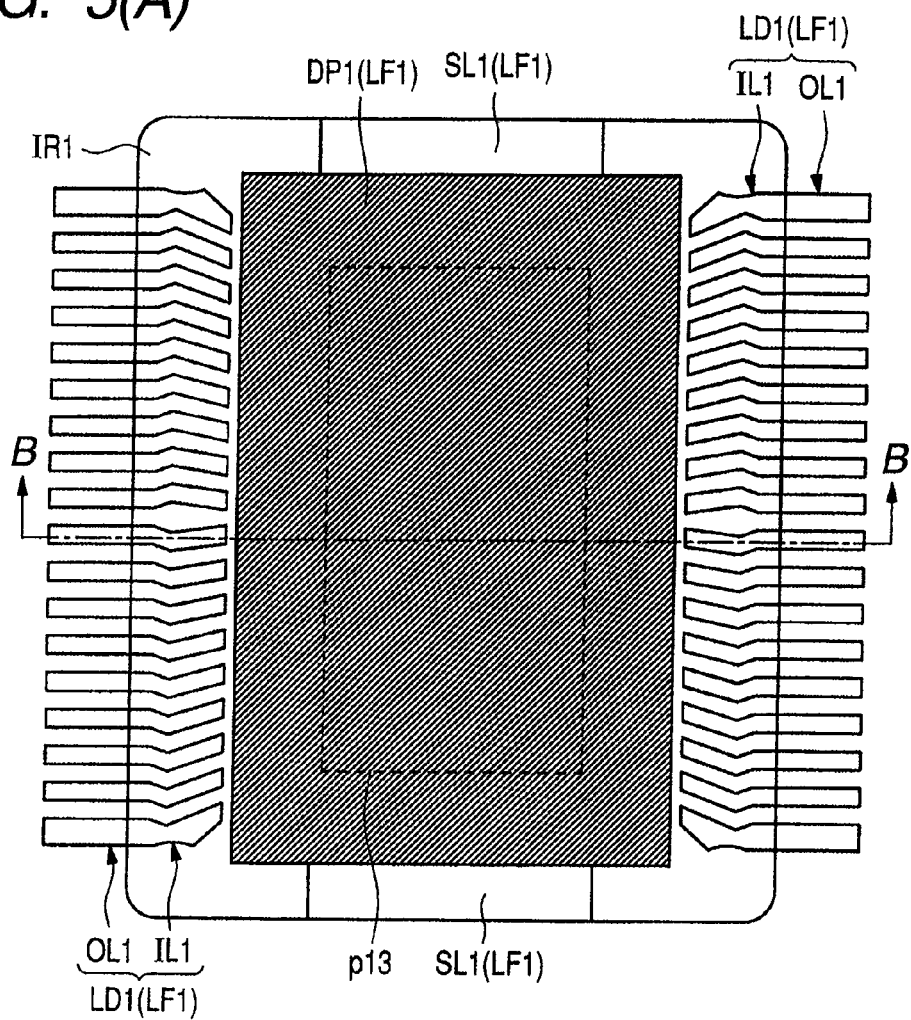
Figure 5B:
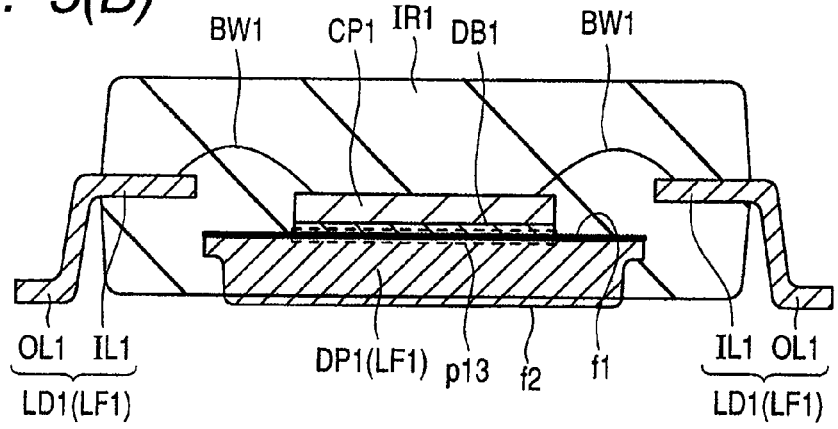
Figure 6A:
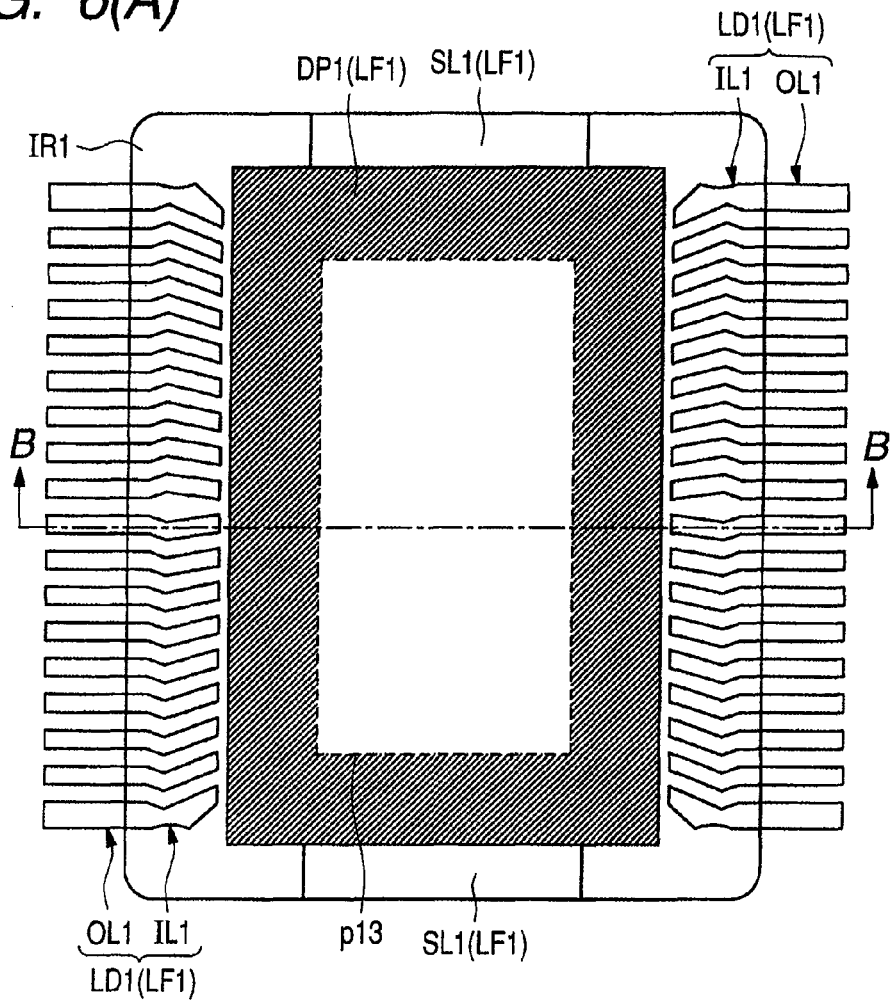
Figure 6B:
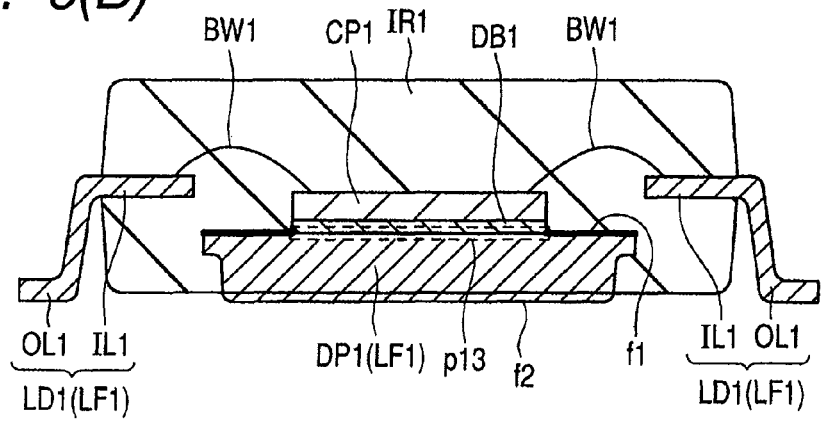

FIGS. 5 and 6 are explanatory views illustrating a region of still further semiconductor devices of Embodiment 1 similar to the region illustrated in FIG. 1. Particularly in the overall plan view of FIG. 5(A) or FIG. 6(A), the semiconductor chip CP1 and the plural bonding wires BW1 are omitted for convenience sake. In the above description, the top surface f1 of the die pad DP1 is entirely rough. In the semiconductor device of Embodiment 1, the die pad DP1 whose surface to be brought into contact with the insulating resin IR1 is rough is effective and a portion p13 which lies below the semiconductor chip CP1 and is not brought into contact with the insulating resin IR1 may have a rough surface as illustrated in FIG. 5 or may not have a rough surface as illustrated in FIG. 6. When the die bonding material DB1 is a resin paste material in the semiconductor device of Embodiment 1, however, the portion p13 of the die pad DP1 which is below the semiconductor chip CP1 and in contact with the die bonding material DB1 has preferably a rough surface, because improvement in the adhesion of the resin paste material with the die pad DP1 having a rough surface can be expected due to a similar anchor effect to that of the insulating resin IR1. Thus, it is possible to improve the adhesion between the die pad DP1 and the die bonding material DB1 comprised of a resin paste material and thereby make the structure resistant to peeling. As a result, the semiconductor device having a semiconductor chip sealed with an insulating resin can have further improved reliability.

From another viewpoint, when a place where the insulating resin IR1 comes into contact with the die pad DP1, the inner lead portion IL1 or the suspension lead portion SL1 has a larger rough surface, higher adhesion with the insulating resin IR1 can be realized. On the other hand, as described above, places such as the plural lead portions LD1 and the suspension lead portion SL1 preferably do not have a rough surface. In the semiconductor device of Embodiment 1, therefore, a portion of the die pad DP1 in contact with the insulating resin IR1 and at the same time having a rough surface is preferably greater than a portion of the semiconductor chip CP1 in contact with the insulating resin IR1. The reason for it will next be described.

Since with an increase in the size of the semiconductor chip CP1, the adhesion area with the die pad DP1 via the die bonding material DB1 becomes greater, a peeling ratio increases. In other words, as the semiconductor chip CP1 is greater, cracks tend to occur in the die bonding material DB1. In the semiconductor device of Embodiment 1, therefore, it is effective to roughen the surface of the die pad DP1 at the periphery of the semiconductor chip CP1 to improve the adhesion with the insulating resin IR1. The term "area of a portion of the semiconductor chip CP1 in contact with the insulating resin IR1" means an area of a portion of the top surface f1 of the die pad DP1 not in contact with the insulating resin IR1. Accordingly, adhesion with the insulating resin IR1 can be maintained and generation of cracks can be suppressed by keeping an area of a rough surface portion greater than the area of the semiconductor chip CP1 on the top surface f1 of the die pad DP1. As a result, the semiconductor device having a semiconductor chip sealed with an insulating resin can have further improved reliability.

As described above, in Embodiment 1, the semiconductor device can have improved reliability by roughening the surface of the die pad DP1, the plural lead portions LD1, and the suspension lead portion SL1 to be brought into contact with the insulating resin IR1. Here, an effective structure can be obtained by roughening a surface partially, for example, by not roughening the surface of the plural lead portions LD1 requiring plating or the surface of the suspension lead portion SL1 requiring cutting.

Figure 7:
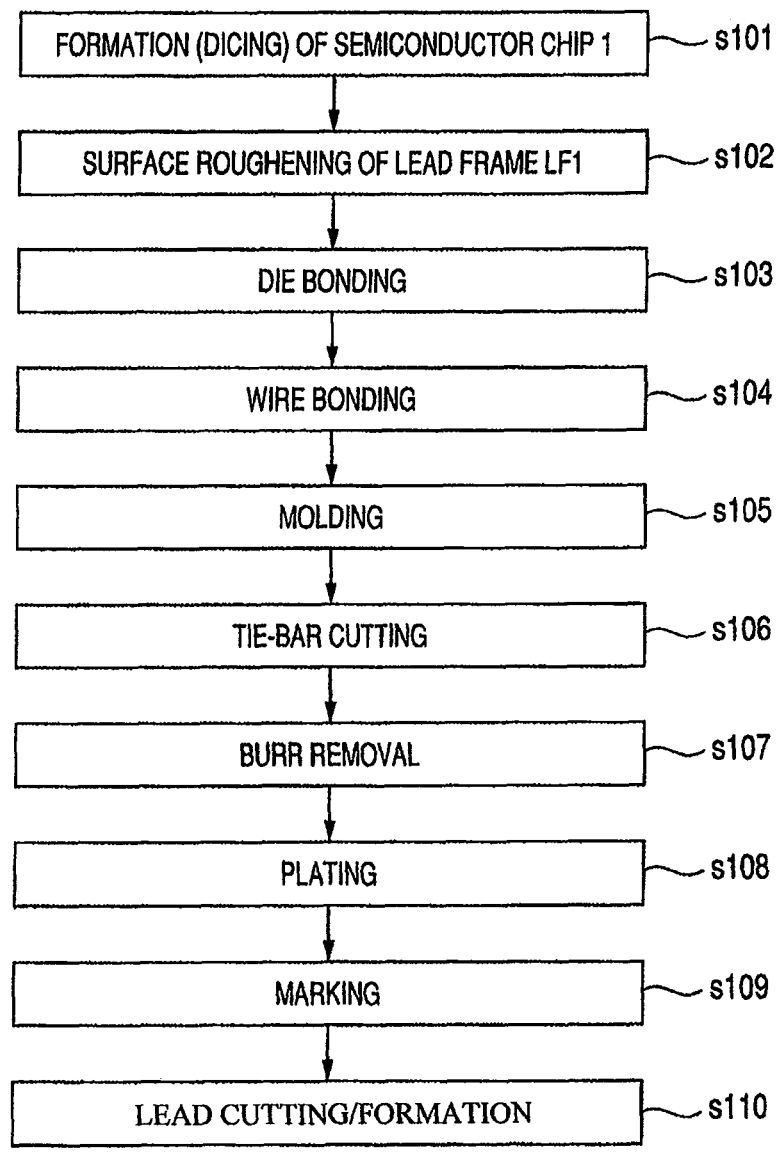
FIG. 7 is a flow chart for explaining manufacturing steps of the semiconductor device according to Embodiment 1 of the invention.

A description will next be made on the effective manufacturing method of a semiconductor device of Embodiment 1 including a step of partially roughening the surfaces of the die pad DP1, the plural lead portions LD1, and the suspension lead portion SL1. First, the manufacturing method is described totally referring to the flow chart of FIG. 7 and fragmentary cross-sectional views (FIGS. 8 to 12) in the element steps thereof. Names of the members correspond to those of the members described referring to FIG. 1 and the like and the shape and material of the members also similar to them unless otherwise particularly indicated.

First, a semiconductor wafer that has finished formation of a semiconductor element and interconnect by using various processes is diced into a semiconductor chip CP1 (dicing step s101 of FIG. 1). Separately from the semiconductor chip, a lead frame LF1 having a die pad DP1, a suspension lead portion LD1, and a plurality of lead portions LD1 and made of a conductor comprised mainly of copper is prepared. A portion of the plural lead portions LD1 to be sealed with an insulating resin IR1 in a later step (molding step s105 of FIG. 1) is called "inner lead portion IL1", while a portion exposed from the insulating resin IR1 without being sealed therewith is called "outer lead portion ° L1". The lead frame OF1 is equipped with a tie bar tb1 (also called damper) for bridging the lead portions LD1 in order to prevent them from being sealed while coming into contact with each other at the end portions thereof.

Figure 8:
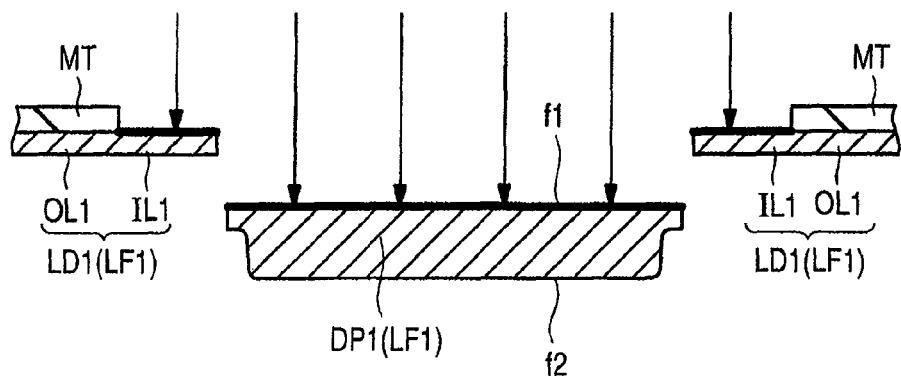
FIG. 8 is a fragmentary cross-sectional view of the semiconductor device according to Embodiment 1 of the invention during a manufacturing step corresponding to a surface roughening step s102 in FIG. 7.

Then, as illustrated in FIG. 8, in the manufacturing method of a semiconductor device according to Embodiment 1, the lead frame LF1 is partially surface-roughened (surface roughening step s102 of FIG. 1). Etching with a chemical solution roughens the surface of the lead frame LF1. During surface roughening, a region of the lead frame LF1 not surface-roughened is covered with a protecting member so as to prevent etching in this region. The protecting member is, for example, a jig or masking tape MT. Alternatively, it may be a photoresist film obtained by patterning by photolithography. In the manufacturing method of a semiconductor device according to Embodiment 1, however, using the masking tape MT as the protecting member is more preferred, because using the masking tape MT enables to precisely form a portion covered with the protecting member and a portion not covered with the protecting member on the lead frame LF1. Specific methods for realizing the surface roughening and advantages thereof, and specific regions to be surface-roughened and advantages thereof will be described later in detail.

Figure 9:
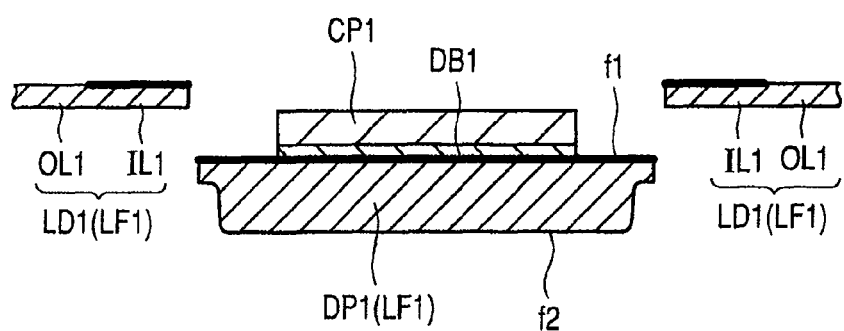
FIG. 9 is a fragmentary cross-sectional view of the semiconductor device during a manufacturing step following that of FIG. 8 and corresponding to a die bonding step s103 in FIG. 7.
Figure 10:
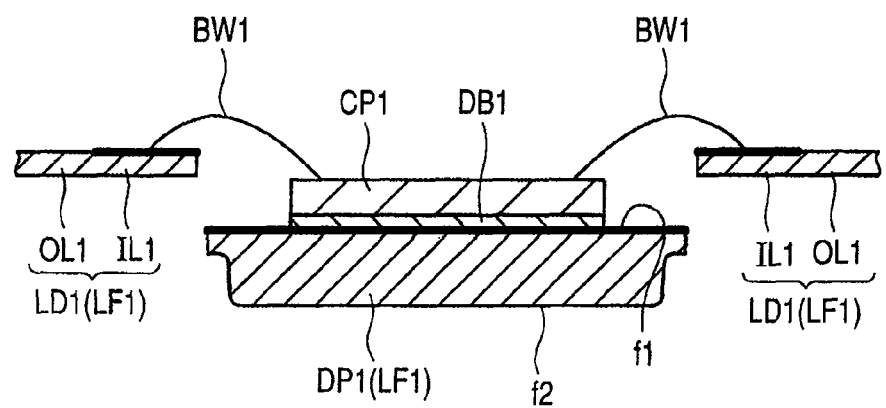
FIG. 10 is a fragmentary cross-sectional view of the semiconductor device during a manufacturing step following that of FIG. 9 and corresponding to a wire bonding step s104 in FIG. 7.

As illustrated in FIG. 9, the semiconductor chip CP1 is then bonded to the top surface f1 of the die pad DP1 via a die bonding material DB1 (die bonding step s103 of FIG. 1). The die bonding material DB1 may be either a solder material having conductivity or a resin paste material comprised of an epoxy resin. Then, as illustrated in FIG. 10, the plural lead portions LD1 and the semiconductor chip CP1 are bonded to each other via bonding wires BW1 (wire bonding step s104 of FIG. 1). In this step, the bonding wires BW1 are coupled with the inner lead portions IL1 of the plural lead portions LD1. The inner lead portions IL1 have already been subjected to a plating treatment.

Figure 11:
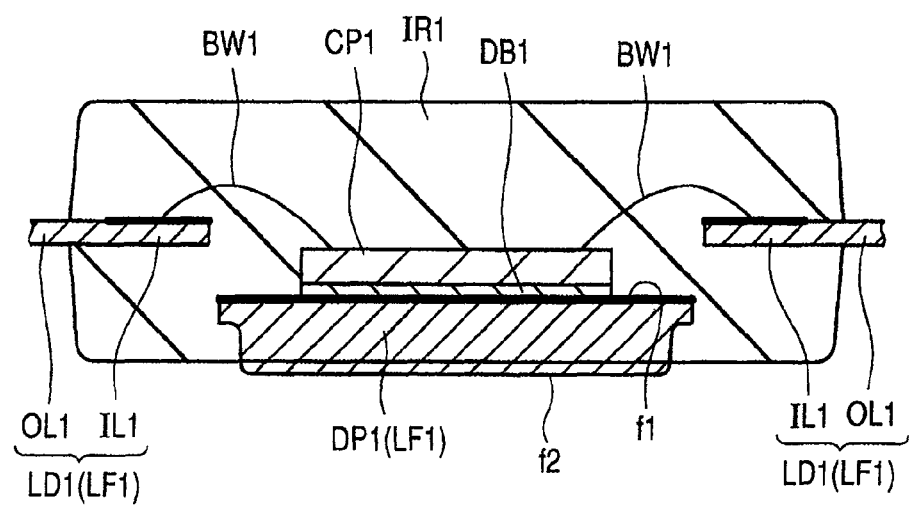
FIG. 11 is a fragmentary cross-sectional view of the semiconductor device during a manufacturing step following that of FIG. 10 and corresponding to a molding step s105 in FIG. 7.

Then, as illustrated in FIG. 11, the inner lead portions IL1 of the plural lead portions LD1, a portion of the die pad DP1, the suspension lead portion SL1, and the semiconductor chip CP1 are sealed integrally with the insulating resin IR1 (molding step s105 of FIG. 1). The top surface f1 is, as the portion of the die pad DP1, sealed with the insulating resin IR1 and the bottom surface f2 is not sealed with the insulating resin IR1. This enables to realize a structure in which the bottom surface f2 of the die pad DP1 is exposed outside from the insulating resin IR1.

Figure 12:
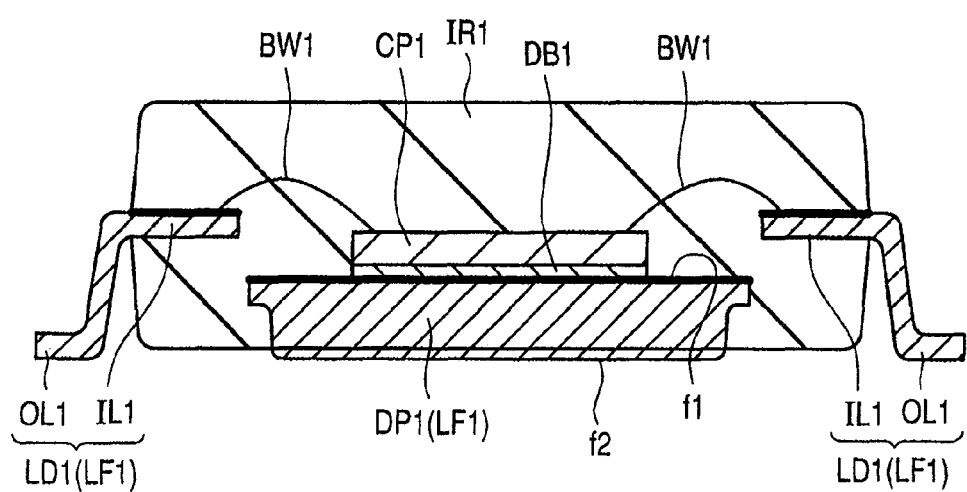
FIG. 12 is a fragmentary cross-sectional view of the semiconductor device during a manufacturing step following that of FIG. 11 and corresponding to a tie bar cutting step s106 in FIG. 7.

In a step subsequent to the molding step, the tie bar tb1 placed so as to prevent contact of the leads in the lead frame LF1 is cut (a tie-bar cutting step s106 of FIG. 1). In this step, the suspension lead portion SL1 outside the insulating resin IR1 is also cut. Then, after removal of a resin burr (burr removal step s107 of FIG. 1), a plating step s108 and a marking step 109 are performed. Finally, in a lead cutting/formation step s110, the plural lead portions LD1 outside the insulating resin IR1 are cut and the outer lead portion OL1 is bent as illustrated in FIG. 12 to complete the formation of the semiconductor device of Embodiment 1.

Figure 13A:
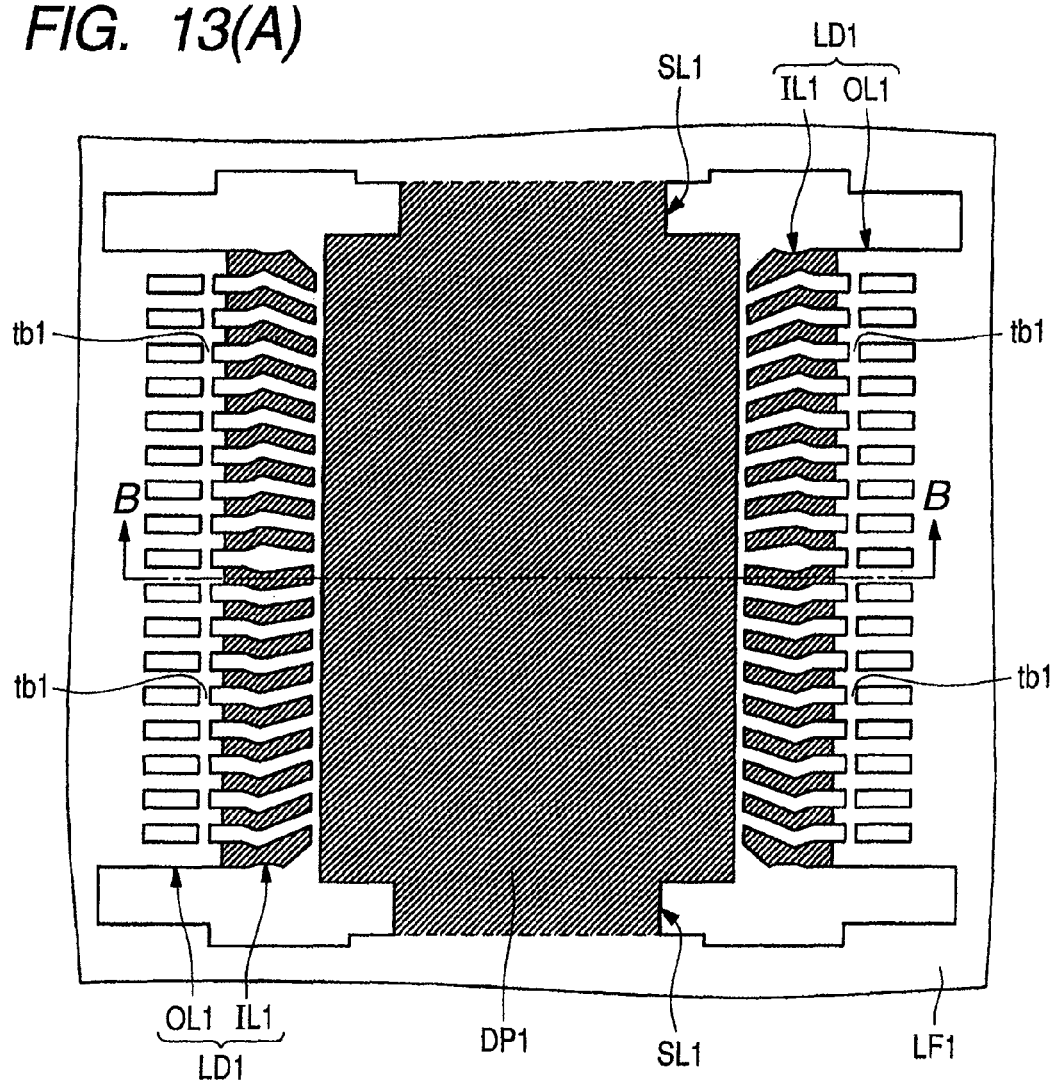
Figure 13B:
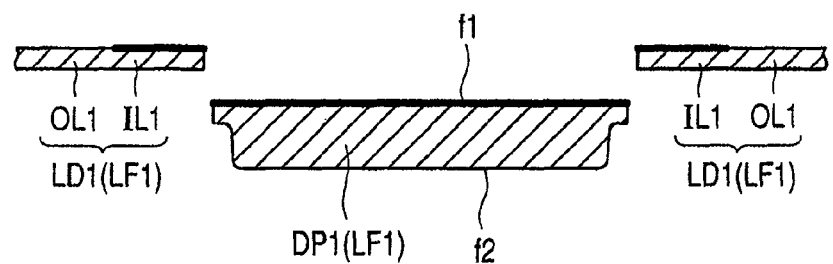

The above-described surface roughening step s102 will next be described more specifically. FIGS. 13(A) and 13(B) are a fragmentary plan view and a fragmentary cross-sectional view of the lead frame LF1 in the surface roughening step s102, wherein the regions illustrated in (A) and (B)

correspond to those of FIG. 1, respectively. As illustrated in FIG. 13, in the manufacturing method of a semiconductor device according to Embodiment 1, a portion of the lead frame LF1 to be brought into contact with the insulating resin IR1 in the later molding step s105 is surface-roughened as illustrated in FIG. 13. Described specifically, the inner lead portions IL1 of the plural lead portions LD1 overlying the lead frame LF1 are surface roughened. In other words, in the surface roughening step s102 in the manufacturing method of a semiconductor device according to Embodiment 1, the back surface of the lead frame LF1 including the bottom surface f2 of the die pad DP1 is not surface roughened but the outer lead portions OL1 of the plural lead portions LD1 are surface roughened. Such surface roughening enables to improve the adhesion between the lead frame LF1 and the insulating resin IR1 as described above.

In particular, the top surface f1 of the die pad DP1 including a portion of the die pad DP1 to be brought into contact with the insulating resin IR1 is roughened. Such surface roughening enables to realize the structure described referring to FIG. 1, improve adhesion between the die pad DP1 and the insulating resin IR1 at the boundary surface thereof, and prevent occurrence of peeling. Even if a package permits easy water penetration through the bottom surface f2 of the die pad DP1 exposed therefrom, it becomes possible to prevent occurrence of cracks in the die bonding material DB1 which will otherwise occur due to peeling at the boundary surface. As a result, the semiconductor device having a semiconductor chip sealed with an insulating resin can have further improved reliability.

Only for the purpose of improving the adhesion between the lead frame LF1 and the insulating resin IR1, it is easy to roughen both the top surface and the bottom surface of the lead frame LF1 irrespective that they are places to be brought into contact with the insulating resin IR1, because this enables to omit a step of forming a masking tape MT or the like for partially surface roughening, which was described above referring to FIG. 8 in the surface roughening step s102. In the manufacturing method of a semiconductor device according to Embodiment 1, however, the partial surface roughening step is employed in order to achieve the advantage described above referring to FIG. 1. The reason for it will next be described specifically.

As described referring to FIG. 1, in the semiconductor device of Embodiment 1, the bottom surface f2 of the die pad DP1 is exposed from the insulating resin IR1 so that the bottom surface f2 of the die pad DP1 can be used as an electrode. Remaining of a resin burr, which is an insulator, on the bottom surface f2 of the die pad DP1 to be used as an electrode is not recommended. From this standpoint, using the manufacturing method of a semiconductor device according to Embodiment 1 is more effective. The bottom surface f2 of the die pad DP1 is not surface-roughened so that even if the insulating resin IR1 runs along the bottom surface f2 and becomes a resin burr in the molding step s105, it does not stick firmly and can be removed easily.

Further, in the manufacturing method of a semiconductor device according to Embodiment 1, the outer lead portions OL1 of the plural lead portions LD1 are not surface roughened. Because of similar reasons to those described above, even if the insulating resin IR1 attaches to the outer lead portions OL1 or the tie bar tb1, it does not stick for firmly and can be removed easily. For example, when the insulating resin IR1 firmly attaches to the outer lead portions OL1 and the tie bar tb1 and cannot be removed because they are surface roughened, there may occur troubles such as generation of foreign particles due to falling of the insulating resin IR1 and breakage of a cutting mold in the tie-bar cutting step s106 or lead cutting/formation step s110 which will be conducted later. The outer lead portions OL1 are not surface-roughened in the manufacturing method according to Embodiment 1 so that such a problem can be avoided. Although a portion of the each of the plural lead portions LD1 is not surface-roughened and a step of forming a masking tape MT or the like is added to increase the number of manufacturing steps, such a method is effective for obtaining a semiconductor device having improved reliability.

Because of the above-described reasons, the manufacturing method of a semiconductor device according to Embodiment 1 employs a partial surface roughening step in which only a portion of the lead frame LF1 is surface roughened without surface-roughening another portion.

There are various etching methods using a chemical solution for surface roughening of the lead frame LF1 made of copper. The effect as described above can be expected from these methods, respectively. In the manufacturing method of a semiconductor device according to Embodiment 1, however, it is preferred to conduct the surface roughening step s102 by using an etching solution comprised mainly of a mixture of hydrogen peroxide water and sulfuric acid, which is based on the following verification by the present inventors.

Figure 14:
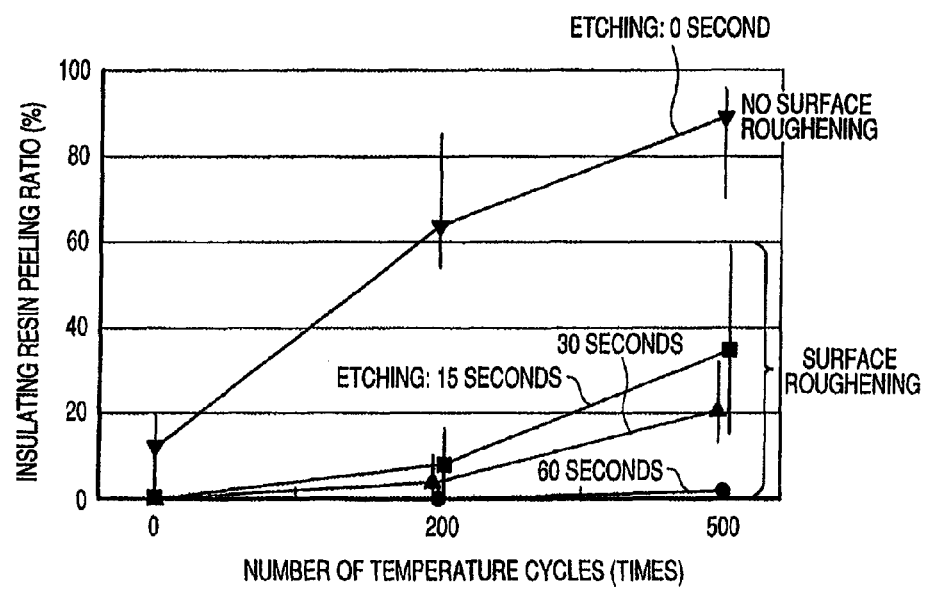
FIG. 14 is a graph for explaining the characteristic of the manufacturing step of the semiconductor device according to Embodiment 1 of the invention.

FIG. 14 is a graph for explaining the dependence of a change in an insulating resin peeling ratio on the surface roughening degree with respect to a change in the number of temperature cycles. The term "the number of temperature cycles" as used herein means the number of a heating or cooling cycle applied to a semiconductor device to be tested. The surface roughening degree is changed according to an immersion time (etching time) of a flame in the above mixed solution of hydrogen peroxide water and sulfuric acid. The graph includes surface roughening degrees at an etching time for 0 second (no surface roughening), 15 seconds, 30 seconds, and 60 seconds. The present inventors have verified that when the etching time is 15 seconds, the frame made of copper has an arithmetic average roughness Ra of about 0.2 μm; when the etching time is 30 seconds, it has an arithmetic average roughness Ra of about 0.3 μm; and when the etching time is 30 seconds, it has an arithmetic average roughness Ra of about 0.45 μm. Further verification has revealed that when the etching time increases and reaches about 60 seconds, an increase in the arithmetic average roughness Ra enters into saturation. Accordingly, etching in Embodiment 1 can form, on the lead frame LF1$a$, a rough surface having concavities and convexities of from 0.2 to 0.5 μm in terms of arithmetic average roughness Ra. In addition, it has been confirmed by the present inventors that the arithmetic average roughness Ra of the lead frame LF1 in a region which has not been etched and therefore does not have a rough surface is 0.1 μm or less.

When the surface roughening is not performed, the insulating resin peeling ratio exceeds 80% at the number of temperature cycles of about 500 as shown in FIG. 14. When the surface roughening is performed, on the other hand, the insulating resin peeling ratio is below 40% under the same condition, suggesting that it is effective. Almost no peeling can be observed from a sample which has been etched for 60 seconds and therefore has an arithmetic average roughness Ra of about 0.45 μm.

Figure 15:
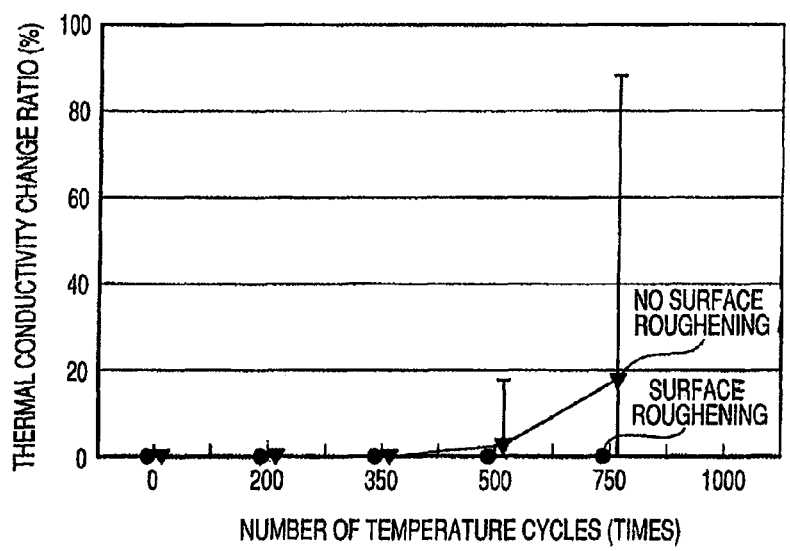
FIG. 15 is a graph for explaining another characteristic of the manufacturing step of the semiconductor device according to Embodiment 1 of the invention.
Figure 16A:
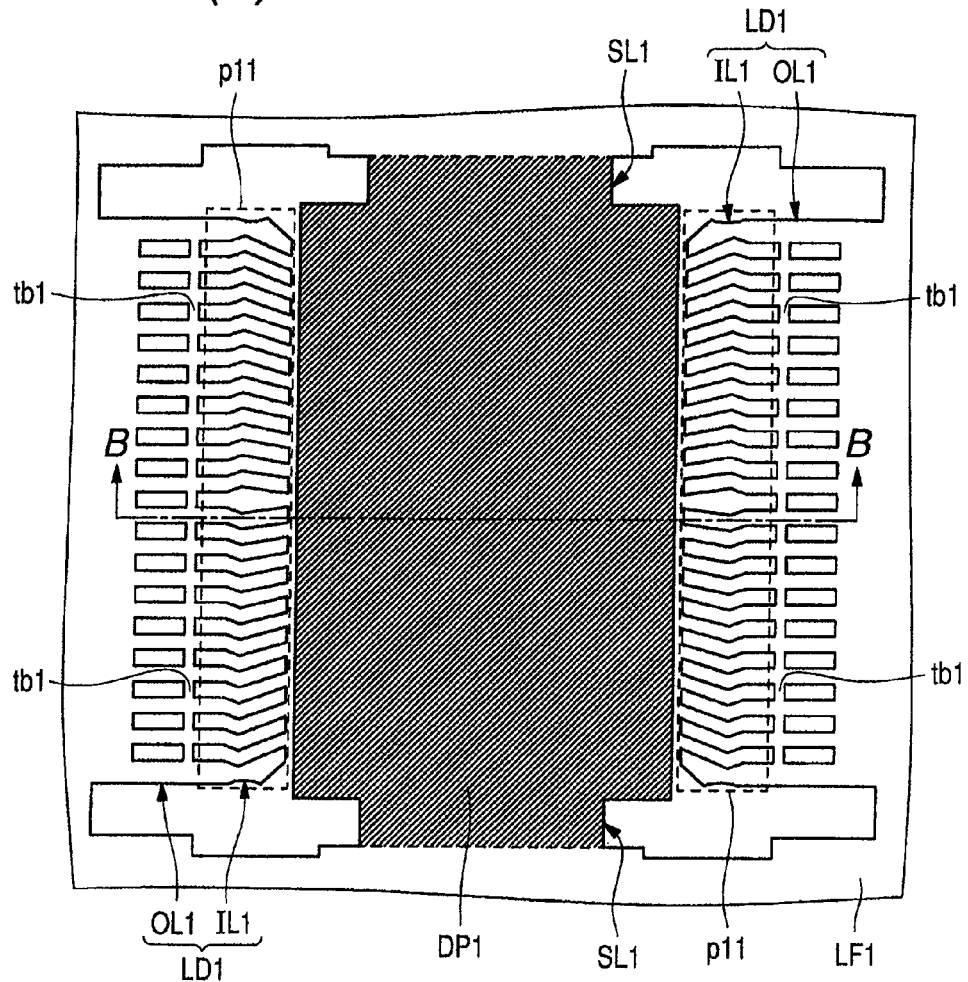
Figure 16B:
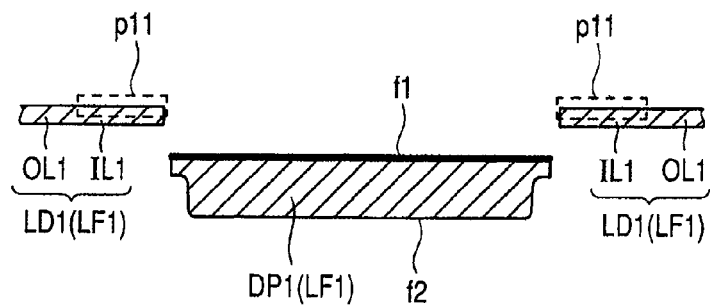
Figure 17A:
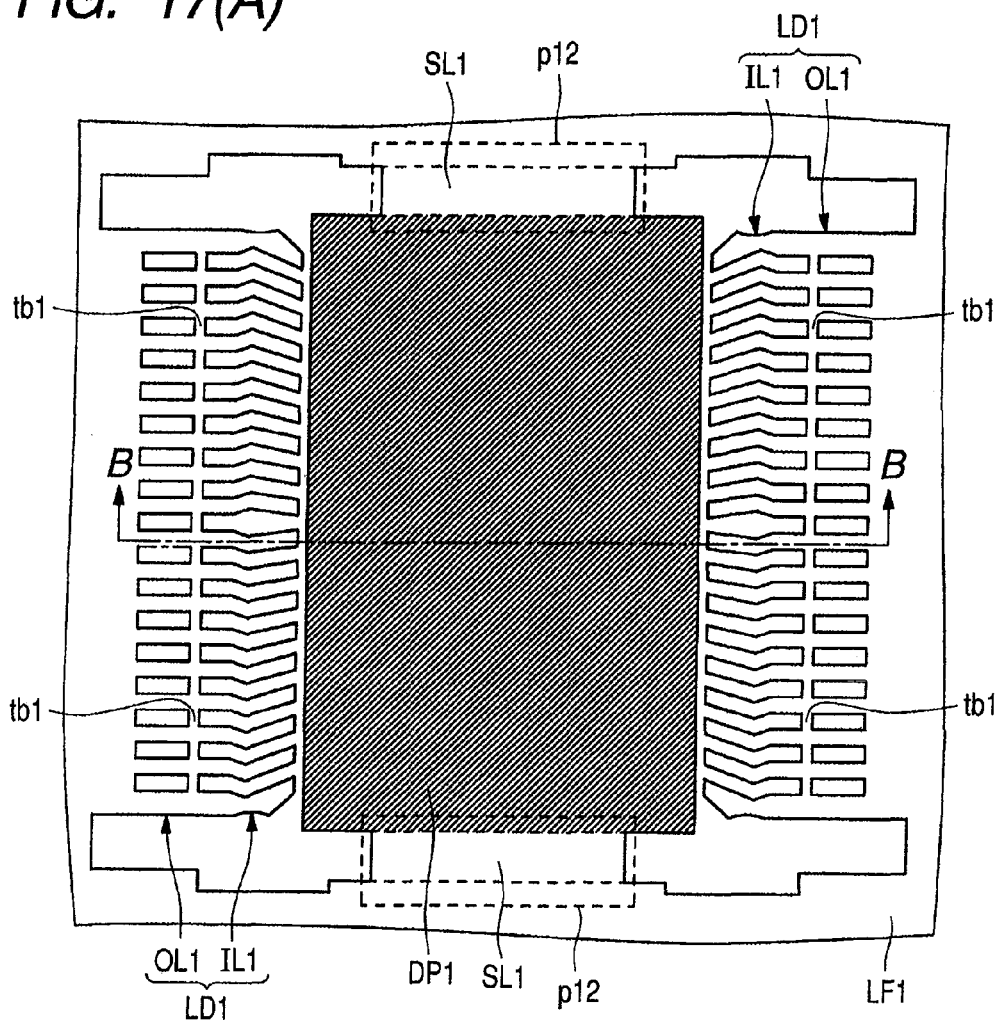
Figure 17B:
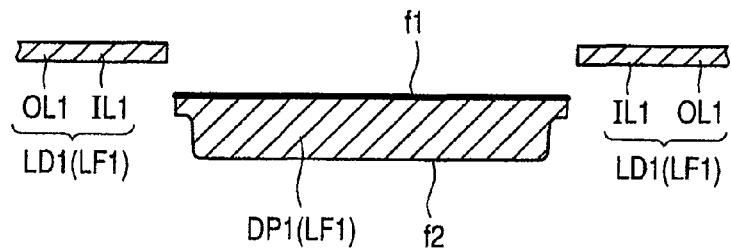
Figure 18A:
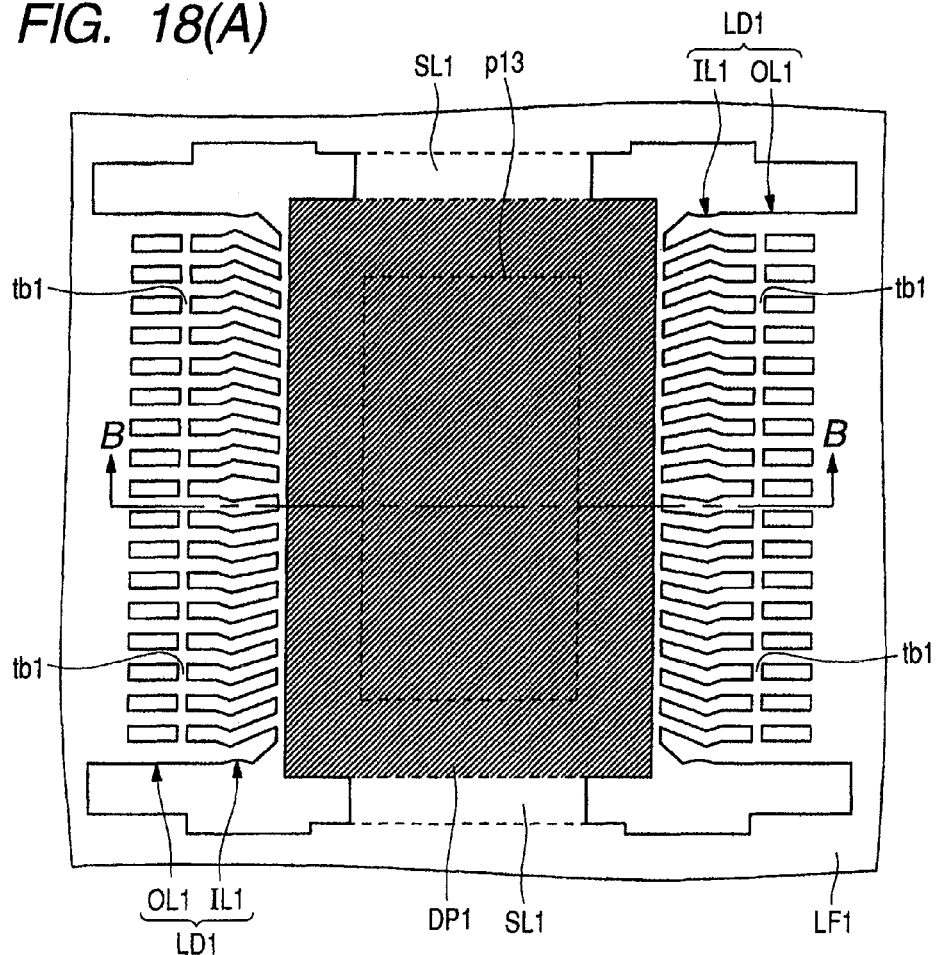
Figure 18B:
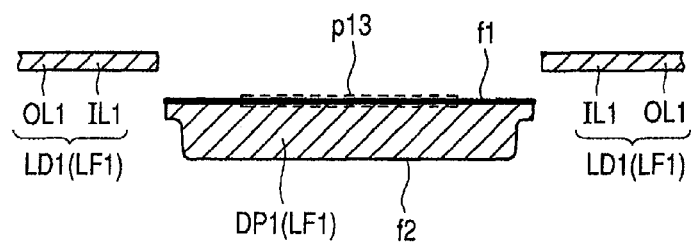

FIG. 15 is a graph for explaining a difference in thermal conductivity change ratio due to presence or absence of the surface roughening treatment with respect to a change in the number of temperature cycles. The term "thermal conductivity change ratio" as used herein means a change ratio in thermal conductivity between the semiconductor chip CP1 and the die pad DP1, for example, in the semiconductor device as illustrated in FIG. 1. An increase in the number of cracks in the die bonding material DB1 causes a decrease in a thermal conductivity between the semiconductor chip CP1 and the die pad DP1 that respectively lie over and below the die bonding material DB1. In short, the thermal conductivity change ratio can be regarded as the crack generation ratio in the die bonding material DB1.

As shown in FIG. 15, when the surface roughening is not performed, an increase in the thermal conductivity change ratio can be observed at the number of temperature cycles exceeding 500, suggesting that cracks occur in the die bonding material DB1. When the surface roughening is performed, on the other hand, the thermal conductivity change ratio remains almost 0% even if the number of temperature cycling exceeds 750, suggesting that occurrence of cracks in the die bonding material DB1 is suppressed.

It has been confirmed from the verification described above that in the manufacturing method of a semiconductor device according to Embodiment 1, surface roughening of the lead frame LF1 by etching is effective for suppressing occurrence of cracks in the die bonding material DB1. In particular, it has been found that partial surface roughening of the lead frame LF1 by etching with an etching solution comprised mainly of a mixed solution of hydrogen peroxide water and sulfuric acid is more effective. It has been found that the lead frame LF1 etched with such a mixed solution has a rough surface having an arithmetic average roughness Ra of from about 0.2 to 0.5 μm. In other words, it has been confirmed that the above-described effect can be achieved when the lead frame LF1 has partially a rough surface with concavities and convexities of from about 0.2 to 0.5 μm in terms of an arithmetic average roughness Ra.

A region to be surface roughened will next be described specifically. FIGS. 16(A), 17(A), and 18(A) and 16(B), 17(B), and 18(B) are fragmentary plan views and fragmentary cross-sectional views of the semiconductor device in the surface roughening step s102 of FIG. 7, respectively, in which regions illustrated in (A) and (B) are similar to those illustrated in FIG. 13.

In the surface roughening step s102 in the manufacturing method of a semiconductor device according to Embodiment 1, it is more preferred to cover, with the masking tape MT, a portion p11 (that it, an inner lead portion IL1) of each of the plural lead portions LD1 to be sealed with the insulating resin IR1 in the molding step s105 which will be performed later and not to carry out surface roughening of the portion. Such selective surface roughening enables to form a semiconductor device having a structure as described referring to FIG. 3. In other words, damage of a plated portion can be reduced by not roughening the surface of the inner lead portion IL1. As a result, the semiconductor device having a semiconductor chip sealed with an insulating resin can have improved reliability.

The verification by the present inventors have revealed that when etching for surface roughening of the lead frame LF1 is performed with a mixed solution of hydrogen peroxide water and sulfuric acid as in Embodiment 1, there appears a difference in the degree of damage, depending on the kind of a plating material. For example, in the case of plating with Ag, the damage caused by the etching solution is not so severe as to adversely affecting the electrical properties. In the case of plating with Ni, on the other hand, the damage caused by the etching solution is so severe as to adversely affecting the electrical properties. Accordingly, as described above, the method of not carrying out surface roughening of the inner lead portion IL1 is more effective when applied to the lead frame LF1 having an inner lead portion IL1 plated with a conductor comprised mainly of Ni.

In the surface roughening step s102 in the manufacturing method of a semiconductor device according to Embodiment 1, as illustrated in FIG. 17, it is more preferred not to roughen the surface of the suspension lead portion SL1 while covering it with the masking tape MT. The reason is that since the insulating resin IR1 which has attached to the suspension lead portion SL1 does not remain firmly thereon and can be removed easily, it is possible to avoid problems such as breakage of a cutting mold and generation of foreign particles derived from the insulating resin IR1 falling when the suspension lead portion SL1 is cut. As a result, the semiconductor device as illustrated in FIG. 4 can be formed.

Figure 19A:
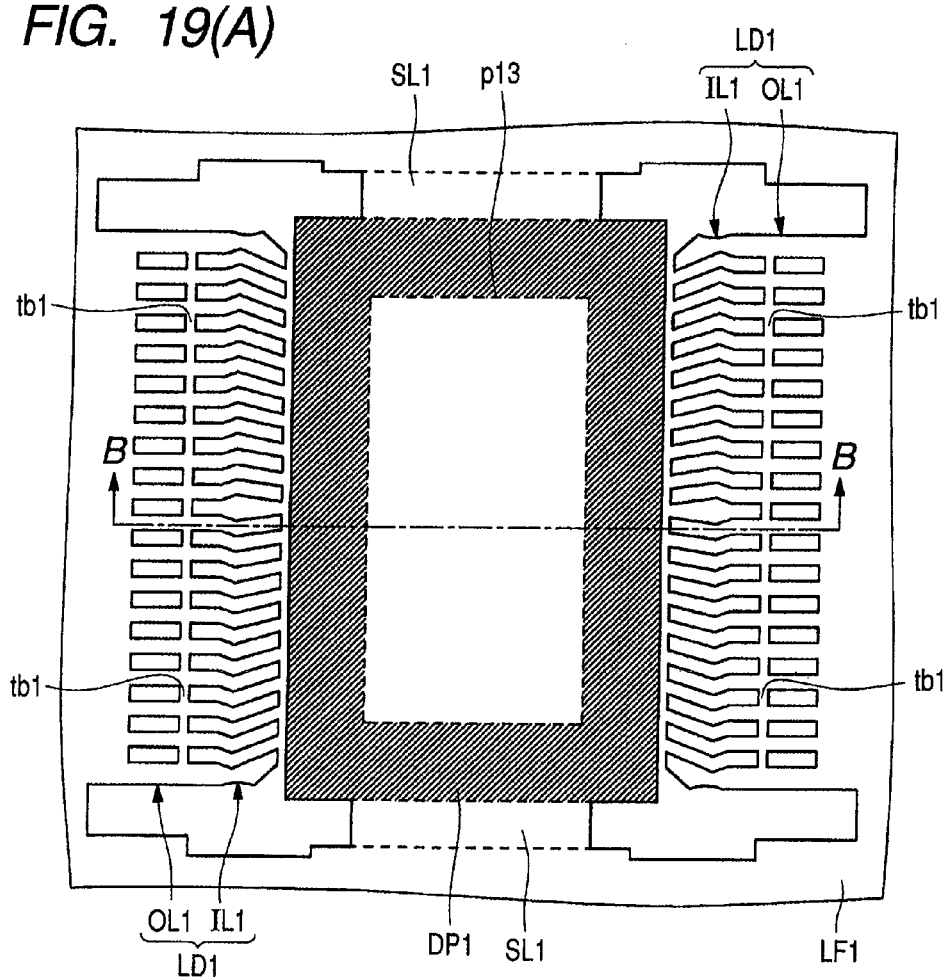
Figure 19B:
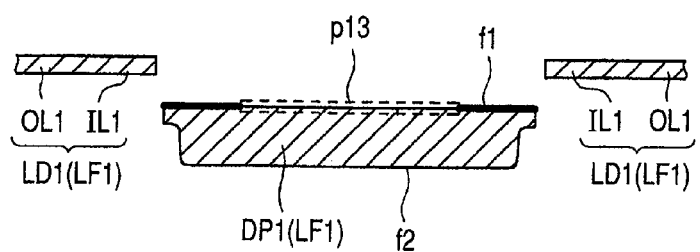

According to the above description, the top surface f1 of the die pad DP1 is rough. The manufacturing method of a semiconductor device according to Embodiment 1 is effective when the surface of the die pad DP1 to be brought into contact with the insulating resin IR1 is rough. The portion p13 which lies below the semiconductor chip CP1 and is not brought into contact with the insulating resin IR1 may either have a rough surface as illustrated in FIG. 18 or not have a rough surface as illustrated in FIG. 19. In the manufacturing method of a semiconductor device according to Embodiment 1, however, it is more preferred that the portion p13 of the die pad DP1 in contact with the die bonding material DB1 below the semiconductor chip CP1 is surface-roughened when a resin paste material is used as the die bonding material DB1. The reason is that the resin paste material can also be expected to exhibit a similar anchor effect to that of the insulating resin IR1 for improving the adhesion with the die pad DP1 having a rough surface. In such a manner, it is possible to improve the adhesion between the die bonding material DB1 made of a resin paste material and the die pad DP1 and form a structure resistant to peeling of them. As a result, the semiconductor device having a semiconductor chip sealed with an insulating resin can have further improved reliability.

From another standpoint, at a place where the lead frame LF1 and the insulating resin IR1 come into contact with each other, as the area of the surface to be roughened is greater, higher adhesion with the insulating resin IR1 can be realized. On the other hand, as described above, there are places not suited for surface roughening such as the plural lead portions LD1 and the suspension lead portion SL1. In the manufacturing method of a semiconductor device according to Embodiment 1, the area of a portion of the die pad DP1 to be brought into contact with the insulating resin IR1 and to be surface-roughened is more preferably greater than the area of a portion of the semiconductor chip CP1 in contact with the insulating resin IR1. The reason for it will next be described.

Since with an increase in the size of the semiconductor chip CP1, an adhesion area of the semiconductor chip CP1 with the die pad DP1 via the die bonding material DB1 increases, which leads to an increase in a peeling ratio. In other words, the greater the area of the semiconductor chip CP1 is, the easier cracks occur in the die bonding material DB1. In the manufacturing method of a semiconductor device of Embodiment 1, as illustrated in FIG. 19, it is effective to roughen the surface of the die pad DP1 around the semiconductor chip CP1, thereby improving the adhesion with the insulating resin IR1. The term "area of a portion of the semiconductor chip CP1 in contact with the insulating resin IR1" as used herein means an area of a portion of the top surface f1 of the die pad DP1 not in contact with the insulating resin IR1. Accordingly, by keeping, on the top surface f1 of the die pad DP1, an area of a portion having a rough surface greater than the area of the semiconductor chip CP1, it is possible to maintain the adhesion with the insulating resin IR1 and prevent generation of cracks. As a result, the semiconductor device having a semiconductor chip sealed with an insulating resin can have further improved reliability.

In the manufacturing method of a semiconductor device according to Embodiment 1, it is possible to obtain a semiconductor device having improved reliability by, as described above, roughening the surface of a portion of the lead frame LF1 to be brought into contact with the insulating resin IR1 and not roughening the bottom surface f2 of the die pad DP1 or the surface of the outer lead portion OL1 in the molding step s105. Here, it is more effective not to roughen the surface of the inner lead portion IL1 requiring plating or the surface of the suspension lead portion SL1 requiring cutting.

Embodiment 2

Figure 20:
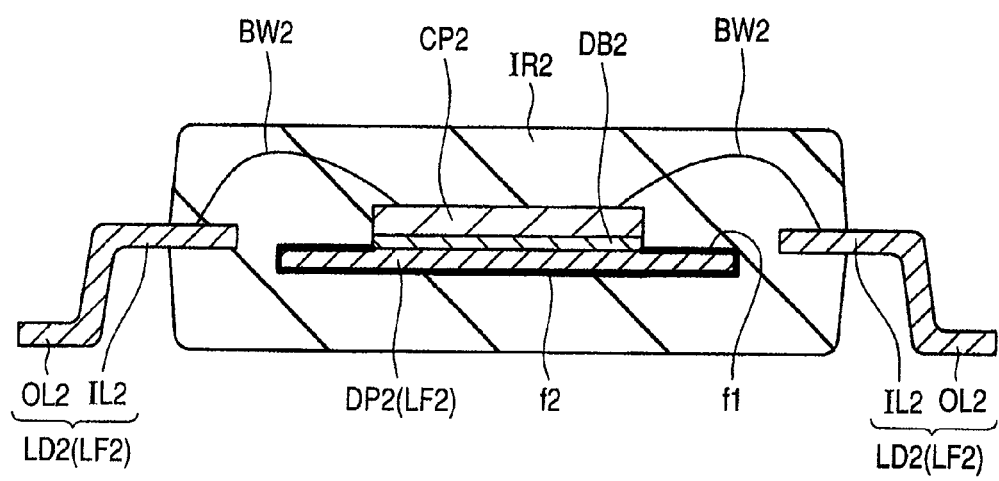
FIG. 20 is a cross-sectional view illustrating the structure of a semiconductor device according to Embodiment 2 of the invention.

FIG. 20 is a cross-sectional view of a semiconductor device according to Embodiment 2. The semiconductor device of Embodiment 2 has a plurality of lead portions LD2 and a die pad DP2. A semiconductor chip CP2 is bonded onto a top surface f1 of the die pad DP2 with a die bonding material DB2. These members are sealed with an insulating resin IR2. A portion of each of the plural lead portions LD2 sealed with the insulating resin IR2 is an inner lead portion IL2 and an outer lead portion OL2 is exposed from the resin. The inner lead portions IL2 and the semiconductor chip CP2 are coupled via a plurality of bonding wires BW2. The above-described configuration provides conduction between the outer lead portion OL2 and the semiconductor chip CP2 via the inner lead portion IL2 and the plural bonding wires BWE. The plural lead portions LD2 and the die pad DP2 are originally members configuring the same lead frame LF2 and are made of a similar copper material. The semiconductor device of Embodiment 2 has, in addition, members similar to those described in Embodiment 1 as a member not illustrated in the drawing. The semiconductor device of Embodiment 2 is different from the semiconductor device of Embodiment 1 in the following standpoint. In short, in the semiconductor device of Embodiment 2, the entirety of the die pad DP2 is sealed with the insulating resin IR2.

A full mold package employed in the semiconductor device of Embodiment 2 has high moisture resistance though having low a heat radiating property, compared with the bottom-surface exposure type package of Embodiment 1. In other words, the full mode package does not permit easy moisture intrusion because the die pad DP2 is not exposed outside from the insulating resin IR2. Accordingly, in the full mode package structure, cracks due to stress do not easily occur in the die bonding material DB2 even if peeling occurs at the boundary surface between the die pad DP2 and the insulating resin IR2. It is however effective to improve the adhesion between the die pad DP2 and the insulating resin IR2 at the boundary surface therebetween from the standpoint of preventing deterioration in mechanical strength which will otherwise occur due to a package crack.

Also in the semiconductor device of Embodiment 2, desired portions of the die pad DP2, the plural lead portions LD2, and the suspension lead portion are surface-roughened in a similar manner to that employed in Embodiment 1. As illustrated in FIG. 20, portions (indicated with a thick solid line in this drawing) of the top surface f1 and the bottom surface f2 of the die pad DP2 to be brought into contact with the insulating resin IR2 are surface-roughened to improve the adhesion between them. This suppresses occurrence of cracks in the insulating resin IR2. As a result, the semiconductor device having a semiconductor chip sealed with an insulating resin can have improved reliability.

Also in the semiconductor device of Embodiment 2, because of similar reasons to those described above in Embodiment 1, a structure in which the outer lead portion OL2 of each of the plural lead portions LD2, the plated portion (when plated with Ni) of the inner lead portion IL2 of each of the plural lead portions LD2, or the suspension lead portion has not been surface-roughened is more preferred. Similarly, when a resin paste material is used as the die bonding material DB2, a structure in which a portion of the die pad DP2 below the semiconductor chip CP2 has been surface-roughened is more preferred. As a result, the semiconductor device having a semiconductor chip sealed with an insulating resin can have more improved reliability.

The invention made by the present inventors has so far been described based on some embodiments. The invention is however not limited to or by them and it is needless to say that various modifications can be made without departing from the scope of the invention.

The invention claimed is:

1. A method of manufacturing a semiconductor device comprising:
    (a) preparing a lead frame having a chip mounting portion and a plurality of leads;
    (b) mounting a semiconductor chip over a first main surface of the chip mounting portion;
    (c) electrically connecting a plurality of pads of an obverse surface of the semiconductor chip and an inner-lead portion of each of the plurality of leads via a plurality of metal wires, respectively; and
    (d) forming a sealing body resin-sealing the semiconductor chip, a part of the first main surface of the chip mounting portion not overlapped with the semiconductor chip, the inner-lead portion of each of parts of the plurality of leads, and the plurality of metal wires,
    wherein, in the step (d), the sealing body is formed such that a second main surface opposite a first main surface of the chip mounting portion is exposed from the sealing body and an outer-lead portion of each of the plurality of leads is projected from the sealing body, and
    wherein a roughness of the first main surface of the chip mounting portion is greater than both a roughness of the second main surface of the chip mounting portion and a roughness of a surface of the inner-lead portion of each of the plurality of leads.

2. The method of manufacturing a semiconductor device according to claim 1, wherein plating is formed on a part of the surface of the inner-lead portion of each of the plurality of leads to which the plurality of metal wires are connected.

3. The method of manufacturing a semiconductor device according to claim 2, wherein the plating is formed of an electrical conductor which includes Ag as a main component.

4. The method of manufacturing a semiconductor device according to claim 1,
    wherein the chip mounting portion and the plurality of leads are each formed of an electrical conductor which includes Cu as a main component.

5. A method of manufacturing a semiconductor device comprising:
    (a) preparing a lead frame having a chip mounting portion and a plurality of leads;
    (b) mounting a semiconductor chip over a first main surface of the chip mounting portion;
    (c) electrically connecting a plurality of pads of an obverse surface of the semiconductor chip and an inner-lead portion of each of the plurality of leads via a plurality of metal wires, respectively;

(d) forming a sealing body resin-sealing the semiconductor chip, a part of the first main surface of the chip mounting portion not overlapped with the semiconductor chip, the inner-lead portion of each of the plurality of leads, and the plurality of metal wires such that a second main surface opposite a first main surface of the chip mounting portion are exposed from the sealing body and an outer-lead portion of each of the plurality of leads is projected from the sealing body;

(e) after the step (d), cutting a part of the outer-lead portion of each of the plurality of leads and separating the plurality of leads from the lead frame; and (f) after the step (e), forming the outer-lead portion of each of the plurality of leads to be bent, wherein a first plating is formed on a part of a surface of the inner-lead portion of each of the plurality of leads to which each of the plurality of metal wires is connected, and wherein a roughness of the first main surface of the chip mounting portion is greater than a roughness of the second main surface of the chip mounting portion, a roughness of the surface of the inner-lead portion of each of the plurality of leads, and a roughness of a surface of the outer-lead portion of each of the plurality of leads.

6. The method of manufacturing a semiconductor device according to claim 5,
wherein the chip mounting portion and the plurality of leads are each formed of an electrical conductor which includes Cu as a main component.

7. A semiconductor device comprising:
a semiconductor chip having an obverse surface over which a plurality of electrode pads are arranged;
a chip mounting portion having a first main surface over which the semiconductor chip is mounted and a second main surface opposite the first main surface;
a plurality of leads having an inner-lead portion and an outer-lead portion, respectively;
a plurality of metal wires electrically connecting to the plurality of electrode pads of the semiconductor chip and the inner-lead portion of each of the plurality of leads, respectively; and
a sealing body resin-sealing the semiconductor chip, a part of the first main surface of the chip mounting portion not overlapped with the semiconductor chip, the inner-lead portion of each of the plurality of leads, and the plurality of metal wires,
wherein the second main surface of the chip mounting portion is exposed from the sealing body and the outer-lead portion of each of the plurality of leads is projected from the sealing body, and
wherein a roughness of the first main surface of the chip mounting portion is greater than both a roughness of the second main surface of the chip mounting portion and a roughness of a surface of the inner-lead portion of each of the plurality of leads.

8. The semiconductor device according to claim 7,
wherein plating is formed on a part of the surface of the inner-lead portion of each of the plurality of leads to which the plurality of metal wires are connected.

9. The semiconductor device according to claim 8,
wherein the plating is formed of an electrical conductor which includes Ag as a main component.

10. The semiconductor device according to claim 7,
wherein the chip mounting portion and the plurality of leads are each formed of an electrical conductor which includes Cu as a main component.

11. A semiconductor device comprising:
a semiconductor chip having an obverse surface over which a plurality of electrode pads are arranged;
a chip mounting portion having a first main surface over which the semiconductor chip is mounted and a second main surface opposite the first main surface;
a plurality of leads having an inner-lead portion and an outer-lead portion, respectively;
a plurality of metal wires electrically connecting to the plurality of electrode pads of the semiconductor chip and the inner-lead portion of each of the plurality of leads, respectively; and
a sealing body resin-sealing the semiconductor chip, a part of the first main surface of the chip mounting portion not overlapped with the semiconductor chip, the inner-lead portion of each of the plurality of leads, and the plurality of metal wires,
wherein the second main surface of the chip mounting portion is exposed from the sealing body and the outer-lead portion of each of the plurality of leads is projected from the sealing body,
wherein plating is formed on a part of a surface of the inner-lead portion of each of the plurality of leads to which the plurality of metal wires are connected,
wherein a roughness of the first main surface of the chip mounting portion is greater than a roughness of the second main surface of the chip mounting portion, a roughness of the surface of the inner-lead portion of each of the plurality of leads, and a roughness of a surface of the outer-lead portion of each of the plurality of the leads and,
wherein the outer-lead portion of each of the plurality of leads is bent.

12. The semiconductor device according to claim 11,
wherein the chip mounting portion and the plurality of leads are each formed of an electrical conductor which includes Cu as a main component.

13. The semiconductor device according to claim 11,
wherein the plating is formed of an electrical conductor which includes Ag as a main component.

14. The semiconductor device according to claim 11, further comprising:
a suspension lead coupling to the chip mounting portion,
wherein a roughness of a part sealed by the sealing body of the suspension lead is smaller than the roughness of the first main surface of the chip mounting portion.

15. The semiconductor device according to claim 11,
wherein an area of a part where the first main surface of the chip mounting portion contacts the sealing body is greater than an area of a part where the semiconductor chip contacts the sealing body.

16. The semiconductor device according to claim 11,
wherein the semiconductor chip is mounted over the first main surface of the chip mounting portion via a die bonding material.

17. The semiconductor device according to claim 16,
wherein the die bonding material is a conductive adhesive.

18. The semiconductor device according to claim 16,
wherein the die bonding material is solder.

19. The method of manufacturing a semiconductor device according to claim 5, further comprising:
(g) after the step (d) and before the step (e), removing a resin burr adhering to the second main surface of the chip mounting portion and the outer-lead portion of each of the plurality of leads.

20. The method of manufacturing a semiconductor device according to claim 19, further comprising:

(h) after the step (g) and before the step (e), plating a second plating to the second main surface of the chip mounting portion and the outer-lead portion of each of the plurality of leads.

21. The method of manufacturing a semiconductor device according to claim 5,
wherein the first plating is formed of an electrical conductor which includes Ag as a main component.

22. The method of manufacturing a semiconductor device according to claim 5,
wherein, after the step (d), a part over which the semiconductor chip is not mounted of the first main surface of the chip mounting portion is contacted with the sealing body.

23. The method of manufacturing a semiconductor device according to claim 5,
wherein the lead frame has a suspension lead to which is coupled the chip mounting portion, and
wherein a roughness of a surface of the suspension lead is smaller than the roughness of the first main surface of the chip mounting portion.

24. The method of manufacturing a semiconductor device according to claim 23, further comprising:

(i) after the step (d), cutting a part of the suspension lead and separating the chip mounting potion from the lead frame.

25. The method of manufacturing a semiconductor device according to claim 22,
wherein an area of a part where the first main surface of the chip mounting portion contacts the sealing body is greater than an area where the semiconductor chip contacts the sealing body.

26. The method of manufacturing a semiconductor device according to claim 5,
wherein, in the step (b), the semiconductor chip is mounted over the first main surface of the chip mounting portion via a die bonding material.

27. The method of manufacturing a semiconductor device according to claim 26,
wherein the die bonding material is a conductive adhesive.

28. The method of manufacturing a semiconductor device according to claim 26,
wherein the die bonding material is solder.

* * * * *